(12) United States Patent
Kishimoto et al.

(10) Patent No.: US 11,011,735 B2
(45) Date of Patent: *May 18, 2021

(54) METHOD AND APPARATUS FOR PRODUCING FLEXIBLE OLED DEVICE

(71) Applicant: Sakai Display Products Corporation, Sakai (JP)

(72) Inventors: Katsuhiko Kishimoto, Osaka (JP); Kohichi Tanaka, Osaka (JP)

(73) Assignee: Sakai Display Products Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/748,012

(22) Filed: Jan. 21, 2020

(65) Prior Publication Data
US 2020/0161595 A1 May 21, 2020

Related U.S. Application Data

(62) Division of application No. 15/774,772, filed as application No. PCT/JP2017/038786 on Oct. 26, 2017, now Pat. No. 10,581,027.

(51) Int. Cl.
*H01L 51/56* (2006.01)
*H01L 27/32* (2006.01)
(Continued)

(52) U.S. Cl.
CPC .......... *H01L 51/56* (2013.01); *H01L 27/3241* (2013.01); *H01L 51/0097* (2013.01); *H05K 3/326* (2013.01); *H01L 2251/5338* (2013.01)

(58) Field of Classification Search
CPC ..... H01L 51/03; H01L 51/5253; H01L 51/56; H01L 51/0097; H01L 27/3244;
(Continued)

(56) References Cited

U.S. PATENT DOCUMENTS 7,078,649 B2 * 7/2006 Okumura ........... B23K 26/0604
219/121.69
7,708,649 B2 * 5/2010 Maraschiello ..... A63B 69/3667
473/257
(Continued)

FOREIGN PATENT DOCUMENTS

JP 5225024 B2 7/2013
JP 2014-048619 A 3/2014
(Continued)

OTHER PUBLICATIONS

Decision to Grant for related Japanese Application No. 2018-510899 dated Apr. 3, 2018.
(Continued)

*Primary Examiner* — Thanh T Nguyen
(74) *Attorney, Agent, or Firm* — Renner, Otto, Boisselle & Sklar, LLP

(57) ABSTRACT

In a flexible OLED device production method, after an intermediate region and flexible substrate region of a plastic film of a multilayer stack are divided, the interface between the flexible substrate region and glass base is irradiated with laser light. The multilayer stack is separated into first and second portions while the multilayer stack is kept in contact with the stage. The first portion includes a plurality of OLED devices in contact with the stage. The OLED devices include a plurality of functional layer regions and the flexible substrate region. The second portion includes the glass base and intermediate region. The laser light is formed from a plurality of arranged laser light sources and irradiation intensity for at least part of the interface between the intermediate region and the glass base is lower than the irradiation intensity for the interface between the flexible substrate region and the glass base.

3 Claims, 20 Drawing Sheets

(51) Int. Cl.
*H01L 51/00* (2006.01)
*H05K 3/32* (2006.01)

(58) Field of Classification Search
CPC ........... H01L 27/3241; H01L 2251/566; H01L 2251/5338; H01L 2227/326; H05K 3/326
See application file for complete search history.

(56) References Cited

U.S. PATENT DOCUMENTS

| | | | |
|---|---|---|---|
| 10,497,887 B1* | 12/2019 | Kishimoto | ............ H01L 51/003 |
| 10,516,001 B2 | 12/2019 | Tanaka et al. | |
| 10,607,513 B2* | 3/2020 | Kishimoto | .......... H01L 51/5246 |
| 2014/0131195 A1* | 5/2014 | Bruland | ................ H01J 37/226 |
| | | | 204/192.34 |
| 2015/0155505 A1 | 6/2015 | Yamazaki et al. | |
| 2017/0278878 A1 | 9/2017 | Kuwabara et al. | |
| 2018/0145255 A1 | 5/2018 | Yu et al. | |

FOREIGN PATENT DOCUMENTS

| | | |
|---|---|---|
| JP | 2014-067671 | 4/2014 |
| JP | 2015-017008 A | 1/2015 |
| JP | 2017-040924 A | 2/2017 |
| JP | 2017-183717 A | 10/2017 |
| WO | WO 2016/200991 A1 | 12/2016 |

OTHER PUBLICATIONS

Allowed claims of parent U.S. Appl. No. 15/774,772, filed May 9, 2018.

* cited by examiner

METHOD AND APPARATUS FOR PRODUCING FLEXIBLE OLED DEVICE

TECHNICAL FIELD

The present disclosure relates to a method and apparatus for producing a flexible OLED device.

BACKGROUND ART

A typical example of the flexible display includes a film which is made of a synthetic resin such as polyimide (hereinafter, referred to as "plastic film"), and elements supported by the plastic film, such as TFTs (Thin Film Transistors) and OLEDs (Organic Light Emitting Diodes). The plastic film functions as a flexible substrate. The flexible display is encapsulated with a gas barrier film (encapsulation film) because an organic semiconductor layer which is a constituent of the OLED is likely to deteriorate due to water vapor.

Production of the above-described flexible display is carried out using a glass base on which a plastic film is formed over the upper surface. The glass base functions as a support (carrier) for keeping the shape of the plastic film flat during the production process. Elements such as TFTs and OLEDs, a gas barrier film, and the other constituents are formed on the plastic film, whereby the structure of a flexible OLED device is realized while it is supported by the glass base. Thereafter, the flexible OLED device is delaminated from the glass base and gains flexibility. The entirety of a portion in which elements such as TFTs and OLEDs are arrayed can be referred to as "functional layer region".

According to the prior art, a sheet-like structure including a plurality of flexible OLED devices is delaminated from a glass base, and thereafter, optical parts and other constituents are mounted to this sheet-like structure. Thereafter, the sheet-like structure is divided into a plurality of flexible devices. This cutting is realized by, for example, laser beam irradiation.

Patent Document No. 1 discloses the method of irradiating the interface between each flexible OLED device and the glass base with laser light (lift-off light) in order to delaminate each flexible OLED device from the glass base (supporting substrate). According to the method disclosed in Patent Document No. 1, after irradiation with the lift-off light, respective flexible OLED devices are divided from one another, and each of the flexible OLED devices is delaminated from the glass base.

CITATION LIST

Patent Literature

Patent Document No. 1: Japanese Laid-Open Patent

SUMMARY OF INVENTION

Technical Problem

According to the conventional production method, the dividing by means of laser beam irradiation is carried out after expensive parts, for example, encapsulation film, polarizer, and/or heat radiation sheet, are mounted to a sheet-like structure including a plurality of flexible OLED devices. Therefore, unnecessary portions divided by laser beam irradiation, i.e., portions which are not to be constituents of a final OLED device, are quite useless. Also, there is a problem that, after being delaminated from the glass base, it is difficult to handle a plurality of flexible OLED devices which have no rigidity.

The present disclosure provides a method and apparatus for producing a flexible OLED device which are capable of solving the above-described problems.

Solution to Problem

The flexible OLED device production method of the present disclosure includes, in an exemplary embodiment: providing a multilayer stack which has a first surface and a second surface, the multilayer stack including a glass base which defines the first surface, a functional layer region including a TFT layer and an OLED layer, a synthetic resin film provided between the glass base and the functional layer region and bound to the glass base, the synthetic resin film including a flexible substrate region supporting the functional layer region and an intermediate region surrounding the flexible substrate region, and a protection sheet which covers the functional layer region and which defines the second surface; dividing the intermediate region and the flexible substrate region of the synthetic resin film from each other; irradiating an interface between the synthetic resin film and the glass base with laser light; and separating the multilayer stack into a first portion and a second portion by increasing a distance from a stage to the glass base while the second surface of the multilayer stack is kept in contact with the stage, wherein the first portion of the multilayer stack includes an OLED device which is in contact with the stage, the OLED device including the functional layer region and the flexible substrate region of the synthetic resin film, the second portion of the multilayer stack includes the glass base and the intermediate region of the synthetic resin film, and irradiating the interface between the synthetic resin film and the glass base with the laser light includes forming the laser light from a plurality of arranged laser light sources such that an irradiation intensity of the laser light for at least part of an interface between the intermediate region of the synthetic resin film and the glass base is lower than an irradiation intensity of the laser light for the interface between the flexible substrate region of the synthetic resin film and the glass base.

In one embodiment, a number of the flexible substrate region of the synthetic resin film is plural, and a number of the OLED device included in the first portion of the multilayer stack is plural.

In one embodiment, the plurality of laser light sources are a plurality of semiconductor laser devices, and irradiating the interface between the synthetic resin film and the glass base with the laser light includes modulating a driving current flowing through each of the plurality of semiconductor laser devices, thereby temporally and/or spatially modulating the irradiation intensity of the laser light.

In one embodiment, the plurality of semiconductor laser devices are arranged in a single row or a plurality of rows, and the irradiation intensity of the laser light has four or more peaks at the interface between the intermediate region of the synthetic resin film and the glass base.

In one embodiment, the laser light is a line beam extending in a first direction which is parallel to a perimeter of the glass base, and irradiating the interface between the synthetic resin film and the glass base with the laser light includes moving an irradiation region on the interface which is to be irradiated with the laser light in a second direction which is transverse to the first direction.

In one embodiment, the at least part of the interface between the intermediate region of the synthetic resin film and the glass base includes a plurality of parallel stripe regions extending in the first direction.

In one embodiment, the at least part of the interface between the intermediate region of the synthetic resin film and the glass base includes a plurality of parallel stripe regions extending in the second direction.

In one embodiment, the at least part of the interface between the intermediate region of the synthetic resin film and the glass base has a width which is not less than 50% of a width of the intermediate region.

In one embodiment, the at least part of the interface between the intermediate region of the synthetic resin film and the glass base has a width which is not less than 1 mm.

In one embodiment, the difference between an irradiation intensity of the laser light in the at least part of the interface between the intermediate region of the synthetic resin film and the glass base and an irradiation intensity of the laser light for the interface between the flexible substrate region of the synthetic resin film and the glass base is not less than 50 mJ/cm$^2$.

In one embodiment, the method further includes, after separating the multilayer stack into the first portion and the second portion, performing a process on the OLED device which is in contact with the stage.

The flexible OLED device production apparatus of the present disclosure includes, in an exemplary embodiment: a stage for supporting a multilayer stack which has a first surface and a second surface, the multilayer stack including a glass base which defines the first surface, a functional layer region including a TFT layer and an OLED layer, a synthetic resin film provided between the glass base and the functional layer region and bound to the glass base, the synthetic resin film including a flexible substrate region supporting the functional layer region and an intermediate region surrounding the flexible substrate region, and a protection sheet which covers the functional layer region and which defines the second surface, the intermediate region and the flexible substrate region of the synthetic resin film being divided from each other; and a lift-off light irradiation unit for irradiating with laser light an interface between the synthetic resin film and the glass base in the multilayer stack supported by the stage, wherein the lift-off light irradiation unit includes a plurality of arranged laser light sources for forming the laser light, and an irradiation intensity of the laser light for at least part of an interface between the intermediate region of the synthetic resin film and the glass base is lower than an irradiation intensity of the laser light for the interface between the flexible substrate region of the synthetic resin film and the glass base.

In one embodiment, the plurality of laser light sources are a plurality of semiconductor laser devices, and the lift-off light irradiation unit includes a laser driving circuit for modulating a driving current flowing through each of the plurality of semiconductor laser devices, thereby temporally and/or spatially modulating the irradiation intensity of the laser light.

In one embodiment, the plurality of semiconductor laser devices are arranged in a single row or a plurality of rows, and the irradiation intensity of the laser light has four or more peaks at the interface between the intermediate region of the synthetic resin film and the glass base.

In one embodiment, the apparatus further includes an actuator for increasing a distance from the stage to the glass base while the stage is kept in contact with the second surface of the multilayer stack, thereby separating the multilayer stack into a first portion and a second portion, wherein the first portion of the multilayer stack includes an OLED device which is in contact with the stage, the OLED device including the functional layer region and the flexible substrate region of the synthetic resin film, and the second portion of the multilayer stack includes the glass base and the intermediate region of the synthetic resin film.

Advantageous Effects of Invention

According to an embodiment of the present invention, a novel method for producing a flexible OLED device which is capable of solving the above-described problems is provided.

DESCRIPTION OF EMBODIMENTS

An embodiment of a method and apparatus for producing a flexible OLED device of the present disclosure is described with reference to the drawings. In the following description, unnecessarily detailed description will be omitted. For example, detailed description of well-known matter and repetitive description of substantially identical elements will be omitted. This is for the purpose of avoiding the following description from being unnecessarily redundant and assisting those skilled in the art to easily understand the description. The present inventors provide the attached drawings and the following description for the purpose of assisting those skilled in the art to fully understand the present disclosure. Providing these drawings and description does not intend to limit the subject matter recited in the claims.

Multilayer Stack

Figure 1A:
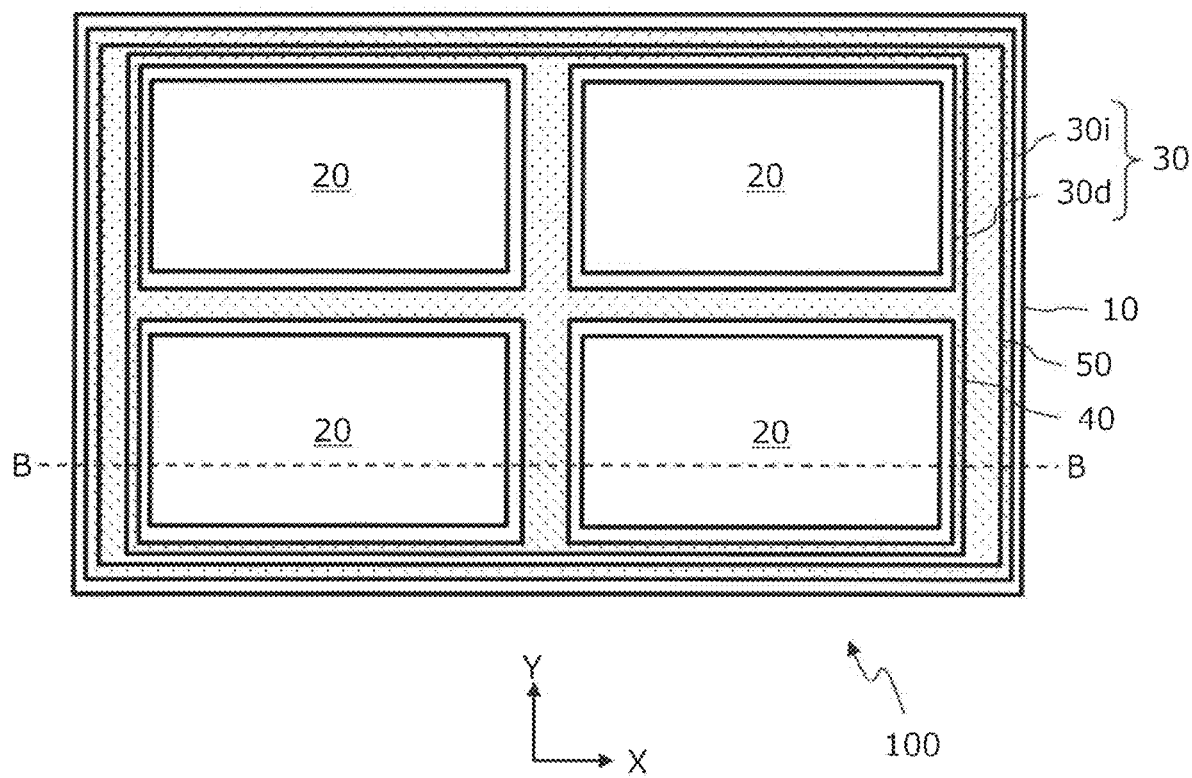
FIG. 1A is a plan view showing a configuration example of a multilayer stack used in a flexible OLED device production method of the present disclosure.
Figure 1B:
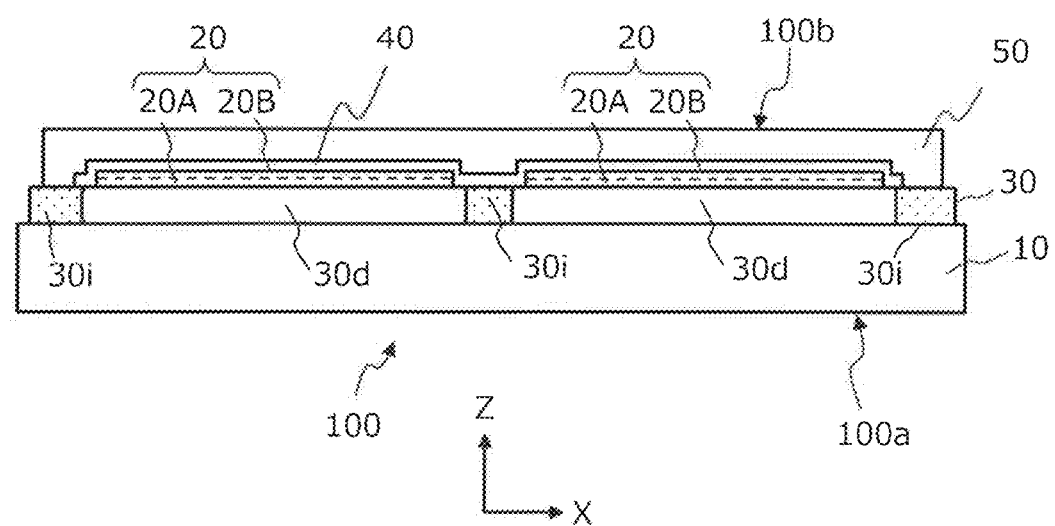
FIG. 1B is a cross-sectional view of the multilayer stack taken along line B-B of FIG. 1A.

See FIG. 1A and FIG. 1B. In a flexible OLED device production method of the present embodiment, firstly, a multilayer stack 100 illustrated in FIG. 1A and FIG. 1B is provided. FIG. 1A is a plan view of the multilayer stack 100. FIG. 1B is a cross-sectional view of the multilayer stack 100 taken along line B-B of FIG. 1A. In FIG. 1A and FIG. 1B, an XYZ coordinate system with X-axis, Y-axis and Z-axis, which are perpendicular to one another, is shown for reference.

The multilayer stack 100 includes a glass base (motherboard or carrier) 10, a plurality of functional layer regions 20 each including a TFT layer 20A and an OLED layer 20B, a synthetic resin film (hereinafter, simply referred to as "plastic film") 30 provided between the glass base 10 and the plurality of functional layer regions 20 and bound to the glass base 10, and a protection sheet 50 covering the plurality of functional layer regions 20. The multilayer stack 100 further includes a gas barrier film 40 provided between the plurality of functional layer regions 20 and the protection sheet 50 so as to cover the entirety of the functional layer regions 20. The multilayer stack 100 may include another unshown layer, such as a buffer layer.

The first surface 100a of the multilayer stack 100 is defined by the glass base 10. The second surface 100b of the multilayer stack 100 is defined by the protection sheet 50. The glass base 10 and the protection sheet 50 are materials temporarily used in the production process but are not constituents of a final flexible OLED device.

The plastic film 30 shown in the drawings includes a plurality of flexible substrate regions 30d respectively supporting the plurality of functional layer regions 20, and an intermediate region 30i surrounding each of the flexible substrate regions 30d. The flexible substrate regions 30d and the intermediate region 30i are merely different portions of a single continuous plastic film 30 and do not need to be physically distinguished. In other words, regions of the plastic film 30 lying immediately under respective ones of the functional layer regions 20 are the flexible substrate regions 30d, and the other region of the plastic film 30 is the intermediate region 30i.

Each of the plurality of functional layer regions is a constituent of a final flexible OLED device. In other words, the multilayer stack 100 has such a structure that a plurality of flexible OLED devices which are not yet divided from one another are supported by a single glass base 10. Each of the functional layer regions 20 has such a shape that, for example, the thickness (size in Z-axis direction) is several tens of micrometers, the length (size in X-axis direction) is about 12 cm, and the width (size in Y-axis direction) is about 7 cm. These sizes can be set to arbitrary values according to the required largeness of the display screen. The shape in the XY plane of each of the functional layer regions 20 is rectangular in the example illustrated in the drawings but is not limited to this example. The shape in the XY plane of each of the functional layer regions 20 may include a square, a polygon, or a shape which includes a curve in the contour.

As shown in FIG. 1A, the flexible substrate regions 30d are two-dimensionally arrayed in rows and columns according to the arrangement of the flexible OLED devices. The intermediate region 30i consists of a plurality of stripes perpendicular to one another and forms a grid pattern. The width of the stripes is, for example, about 1-4 mm. The flexible substrate region 30d of the plastic film 30 functions as the "flexible substrate" in each flexible OLED device which is in the form of a final product. Meanwhile, the intermediate region 30i of the plastic film 30 is not a constituent of the final product.

In an embodiment of the present disclosure, the configuration of the multilayer stack 100 is not limited to the example illustrated in the drawings. The number of functional layer regions 20 (the number of OLED devices) supported by a single glass base 10 does not need to be plural but may be singular. If the number of functional layer regions 20 is singular, the intermediate region 30i of the plastic film 30 forms a simple frame pattern surrounding a single functional layer region 20.

The size or proportion of each component illustrated in respective drawings is determined from the viewpoint of understandability. The actual size or proportion is not necessarily reflected in the drawings.

Figure 1C:
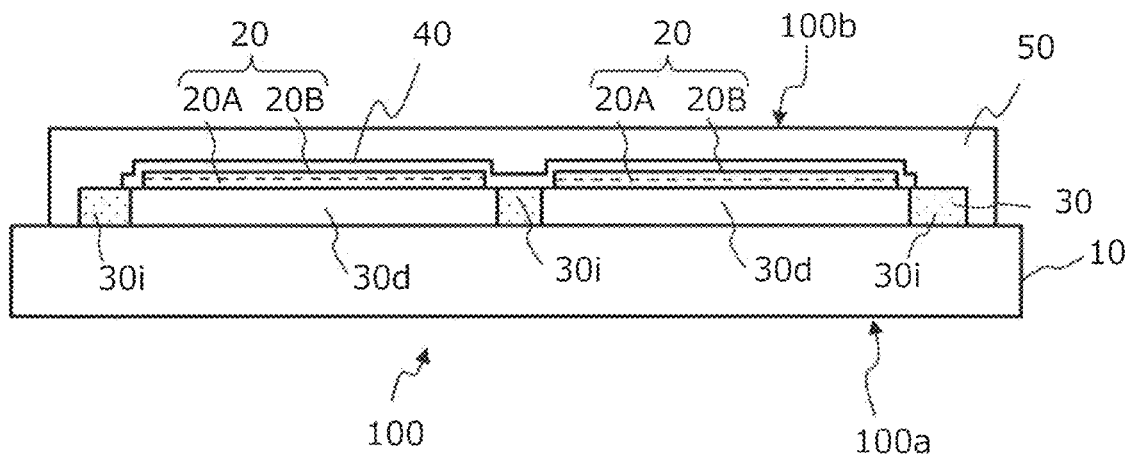
FIG. 1C is a cross-sectional view showing another example of the multilayer stack.
Figure 1D:
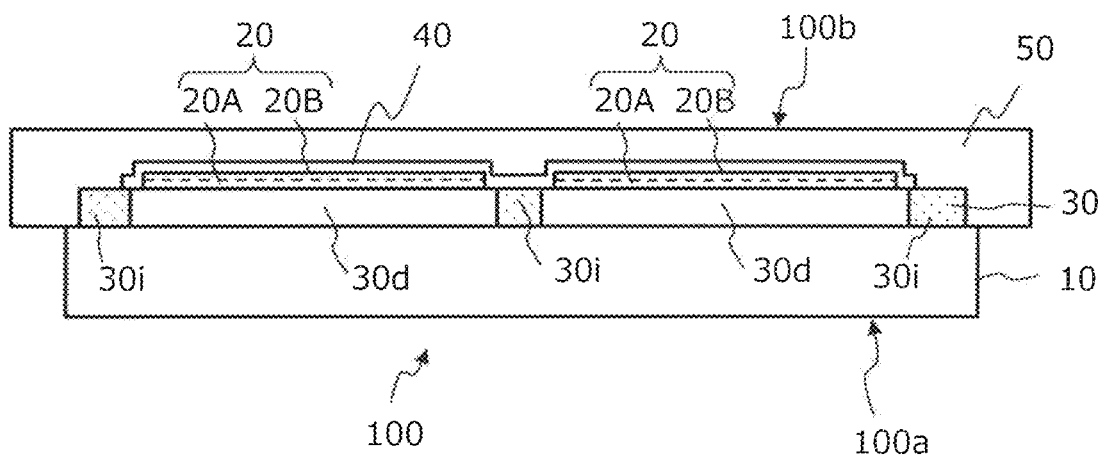
FIG. 1D is a cross-sectional view showing still another example of the multilayer stack.

The multilayer stack 100 which can be used in the production method of the present disclosure is not limited to the example illustrated in FIG. 1A and FIG. 1B. FIG. 1C and FIG. 1D are cross-sectional views showing other examples of the multilayer stack 100. In the example illustrated FIG. 1C, the protection sheet 50 covers the entirety of the plastic film 30 and extends outward beyond the plastic film 30. In the example illustrated FIG. 1D, the protection sheet 50 covers the entirety of the plastic film 30 and extends outward beyond the glass base 10. As will be described later, after the glass base 10 is separated from the multilayer stack 100, the multilayer stack 100 is a thin flexible sheet-like structure which has no rigidity. The protection sheet 50 serves to protect the functional layer regions 20 from impact and abrasion when the functional layer regions 20 collide with or come into contact with external apparatuses or instruments in the step of delaminating the glass base 10 and the steps after the delaminating. Since the protection sheet 50 is peeled off from the multilayer stack 100 in the end, a typical example of the protection sheet 50 has a laminate structure which includes an adhesive layer of a relatively small adhesive force (a layer of an applied mold-releasing agent) over its surface. The more detailed description of the multilayer stack 100 will be described later.

Dividing of OLED Devices

According to the flexible OLED device production method of the present embodiment, after the step of providing the above-described multilayer stack 100, the step of dividing an intermediate region 30i and respective ones of a plurality of flexible substrate regions 30d of the plastic film 30 from one another is carried out.

Figure 2:
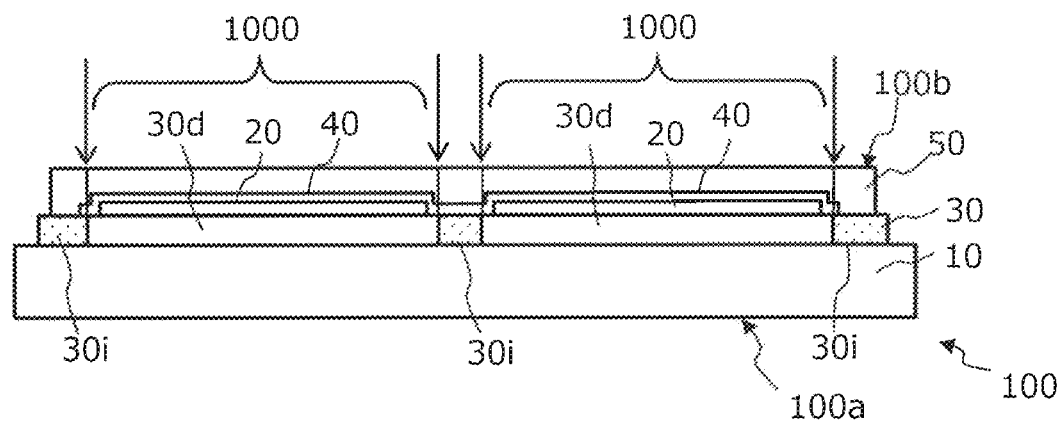
FIG. 2 is a cross-sectional view schematically showing the dividing positions in the multilayer stack.

FIG. 2 is a cross-sectional view schematically showing the positions for dividing the intermediate region 30i and respective ones of the plurality of flexible substrate regions 30d of the plastic film 30 from one another. The positions of irradiation extend along the periphery of each of the flexible substrate regions 30d. In FIG. 2, the positions indicated by arrows are irradiated with a laser beam for cutting. Part of the multilayer stack 100 exclusive of the glass base 10 is cut into a plurality of OLED devices 1000 and the remaining unnecessary portions. By cutting, a gap of several tens of micrometers to several hundreds of micrometers is formed between each of the OLED devices 1000 and a portion surrounding the OLED device 1000. The cutting can also be realized by a dicing saw instead of the laser beam irradiation. After the cutting, the OLED devices 1000 and the remaining unnecessary portions are still bound to the glass base 10.

When the cutting is realized by a laser beam, the wavelength of the laser beam may be in any of the infrared, visible and ultraviolet bands. From the viewpoint of reducing the effect of the cutting on the glass base 10, the laser beam desirably has a wavelength in the range of green to ultraviolet. For example, when a Nd:YAG laser device is used, the cutting can be carried out using a second harmonic wave (wavelength: 532 nm) or a third harmonic wave (wavelength: 343 nm or 355 nm). In such a case, the laser power is adjusted to 1 to 3 watts, and the scanning rate is set to about 500 mm per second, so that the multilayer structure supported by the glass base 10 can be cut (divided) into OLED devices and unnecessary portions without damaging the glass base 10.

According to the embodiment of the present disclosure, the timing of the above-described cutting is earlier than in the prior art. Since the cutting is carried out while the plastic film 30 is bound to the glass base 10, alignment for the cutting can be made with high precision and accuracy even if the gap between adjoining OLED devices 1000 is narrow. Thus, the gap between adjoining OLED devices 1000 can be shortened, and accordingly, useless portions which are unnecessary for a final product can be reduced. In the prior art, after the delaminating from the glass base 10, a polarizer, a heat radiation sheet, and/or an electromagnetic shield can be adhered to the plastic film 30 so as to cover the entirety of the surface (delaminated surface) of the plastic film 30. In such a case, the polarizer, the heat radiation sheet, and/or the electromagnetic shield are also divided by cutting into portions covering the OLED devices 1000 and the remaining unnecessary portions. The unnecessary portions are disposed of as waste. On the other hand, according to the production method of the present disclosure, production of such waste can be suppressed as will be described later.

Lift-Off Light Irradiation

After the intermediate region 30i and respective ones of the plurality of flexible substrate regions 30d of the plastic film 30 are divided from one another, the step of irradiating the interface between the flexible substrate regions 30d of the plastic film 30 and the glass base 10 with laser light is carried out using a lift-off light irradiation unit.

Figure 3A:
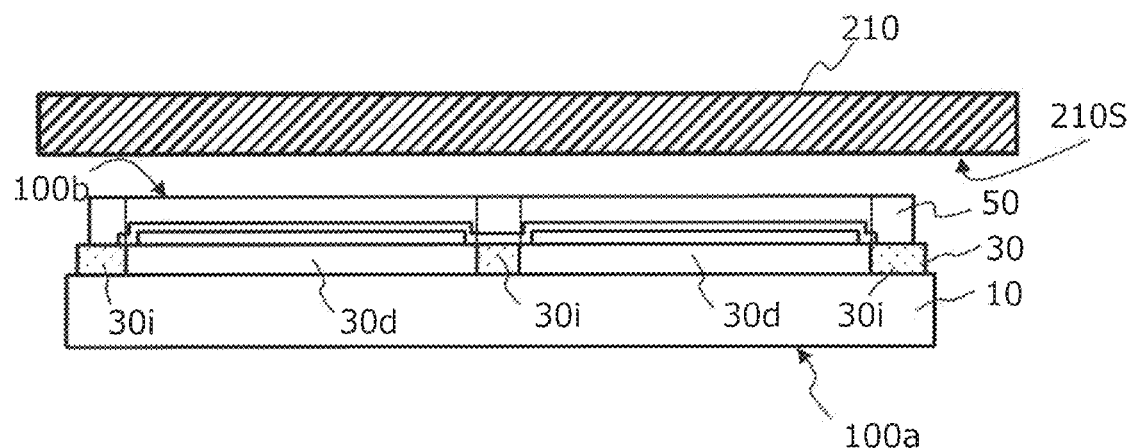
FIG. 3A is a diagram schematically showing a state immediately before a stage supports a multilayer stack.

FIG. 3A schematically shows a state immediately before the stage 210 supports the multilayer stack 100. In the present embodiment, the stage 210 is a chuck stage which has a large number of pores in the surface for suction. The multilayer stack 100 is arranged such that the second surface 100b of the multilayer stack 100 faces the surface 210S of the stage 210, and is supported by the stage 210.

Figure 3B:
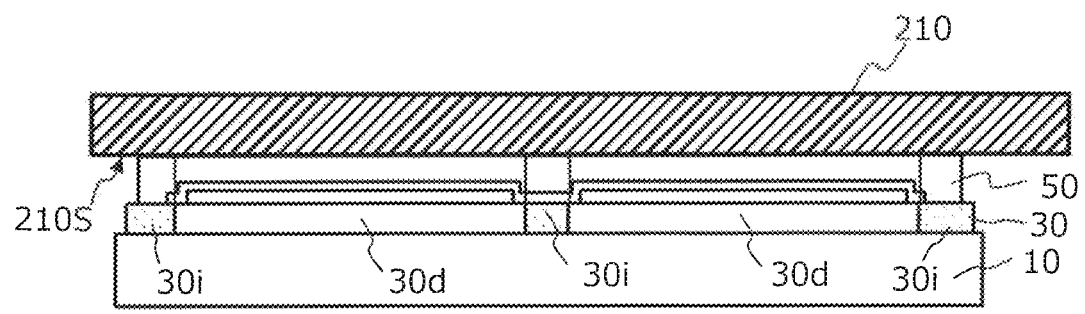
FIG. 3B is a diagram schematically showing a state where the stage supports the multilayer stack.

FIG. 3B schematically shows a state where the stage 210 supports the multilayer stack 100. The arrangement of the stage 210 and the multilayer stack 100 is not limited to the example illustrated in the drawing. For example, the multilayer stack 100 may be placed upside down such that the stage 210 is present under the multilayer stack 100.

In the example illustrated in FIG. 3B, the multilayer stack 100 is in contact with the surface 210S of the stage 210, and the stage 210 holds the multilayer stack 100 by suction.

Figure 3C:
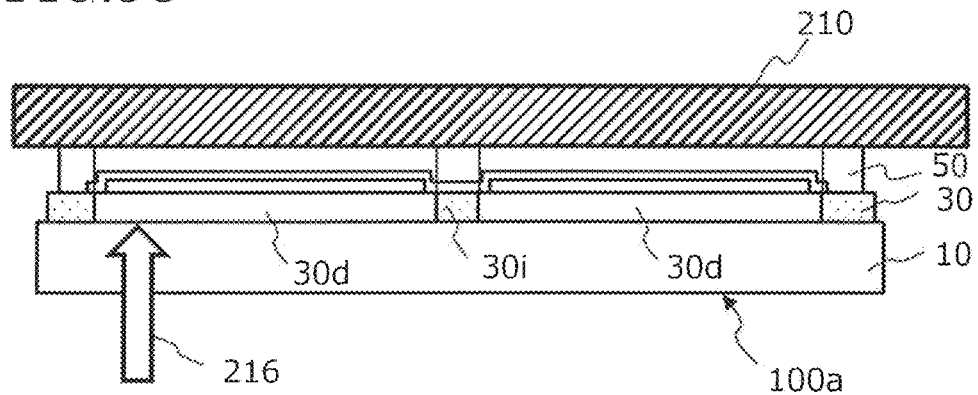
FIG. 3C is a diagram schematically showing that the interface between a glass base and a plastic film of the multilayer stack with laser light (lift-off light).

Then, as shown in FIG. 3C, the interface between the plastic film 30 and the glass base 10 is irradiated with laser light (lift-off light) 216. FIG. 3C schematically illustrates irradiation of the interface between the glass base 10 and the plastic film 30 of the multilayer stack 100 with the lift-off light 216 in the shape of a line extending in a direction vertical to the sheet of the drawing. A part of the plastic film 30 at the interface between the glass base 10 and the plastic film 30 absorbs the lift-off light 216 and decomposes (disappears). By scanning the above-described interface with the lift-off light 216, the degree of binding of the plastic film 30 to the glass base 10 is reduced. The wavelength of the lift-off light 216 is typically in the ultraviolet band. The wavelength of the lift-off light 216 is selected such that the lift-off light 216 is hardly absorbed by the glass base 10 but is absorbed by the plastic film 30 as much as possible. The light absorption by the glass base 10 is, for example, about 10% in the wavelength range of 343-355 nm but can increase to 30-60% at 308 nm.

Hereinafter, lift-off light irradiation according to the present embodiment is described in detail.

Lift-Off Light Irradiation Unit

In the present embodiment, the lift-off light irradiation unit includes a line beam source for emitting lift-off light 216. The line beam source includes a laser device and a plurality of arranged laser light sources. A typical example of the laser light sources is a semiconductor laser device (laser diode). In the present disclosure, the lift-off light irradiation unit is referred to as "laser lift-off (LLO) unit".

Figure 4:
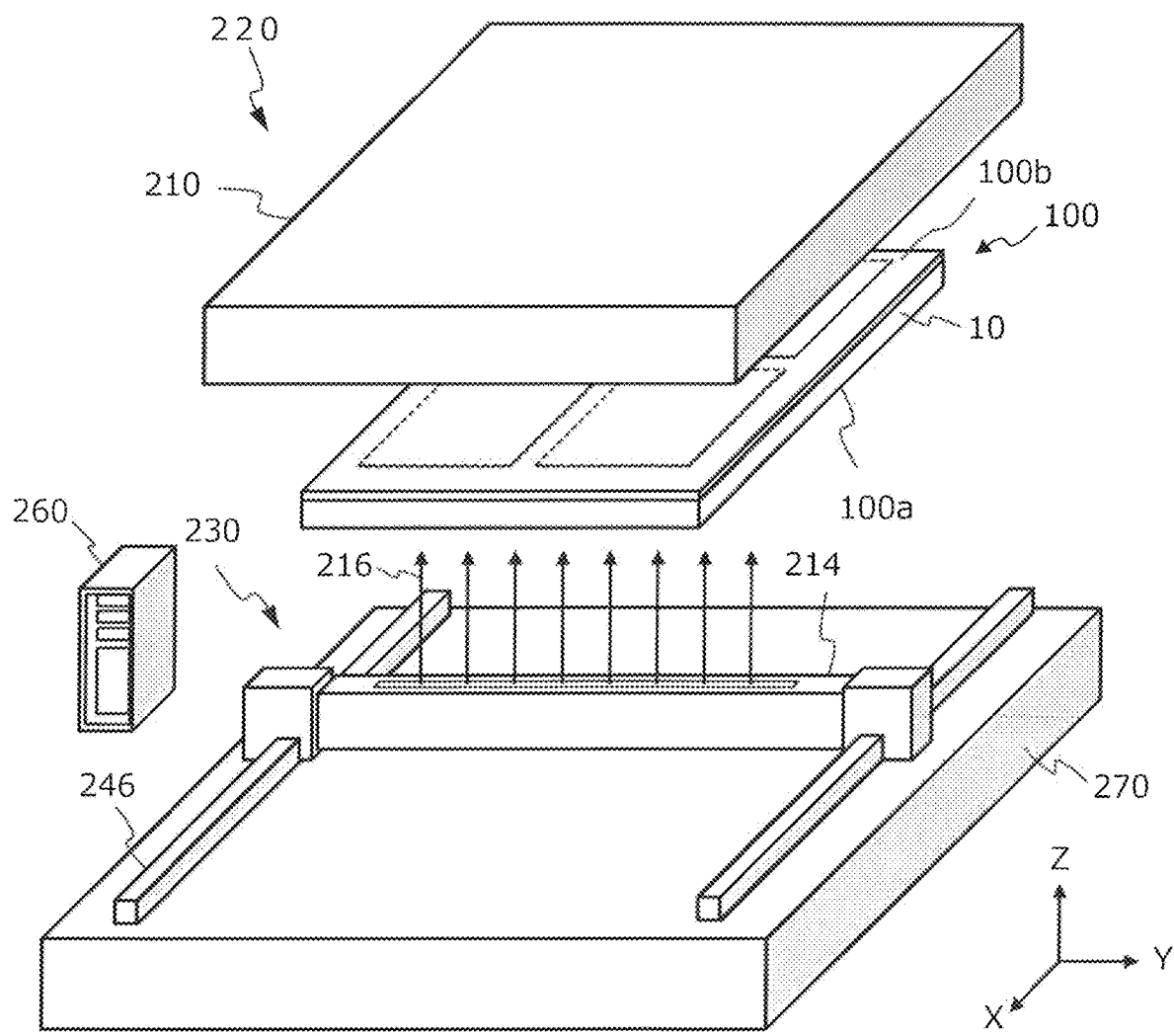
FIG. 4 is a perspective view schematically showing irradiation of a multilayer stack with laser light (lift-off light) emitted from a laser light source of a lift-off light irradiation unit.

FIG. 4 is a perspective view schematically showing irradiation of the multilayer stack 100 with a line beam (lift-off light 216) emitted from the line beam source 214 of a LLO unit 220 of the present embodiment. For the sake of understandability, the stage 210, the multilayer stack 100 and the line beam source 214 are shown as being spaced away from one another in the Z-axis direction of the drawing. During irradiation with the lift-off light 216, the second surface 100b of the multilayer stack 100 is in contact with the stage 210.

The LLO unit 220 illustrated in FIG. 4 includes a transporting device 230 for moving the line beam source 214 such that the irradiation position of the line beam on the multilayer stack 100 moves in a direction transverse to the line beam (scanning direction). The transporting device 230 illustrated in the drawing includes a supporting base 270 and a guide 246 for guiding the movement of the line beam source 214. The transporting device 230 includes an actuator such as, for example, a motor and is capable of conveying the line beam source 214. The motor may be a rotating electric machine, such as DC motor, three-phase AC motor, stepping motor, or may be a linear motor or an ultrasonic motor. When an ultrasonic motor is used, highly-accurate positioning is possible as compared with the other types of motors. Further, the ultrasonic motor provides large holding power when it is not moving, and can hold without supply of electric power. Therefore, the heat generation is small when it is not moving.

Figure 5:
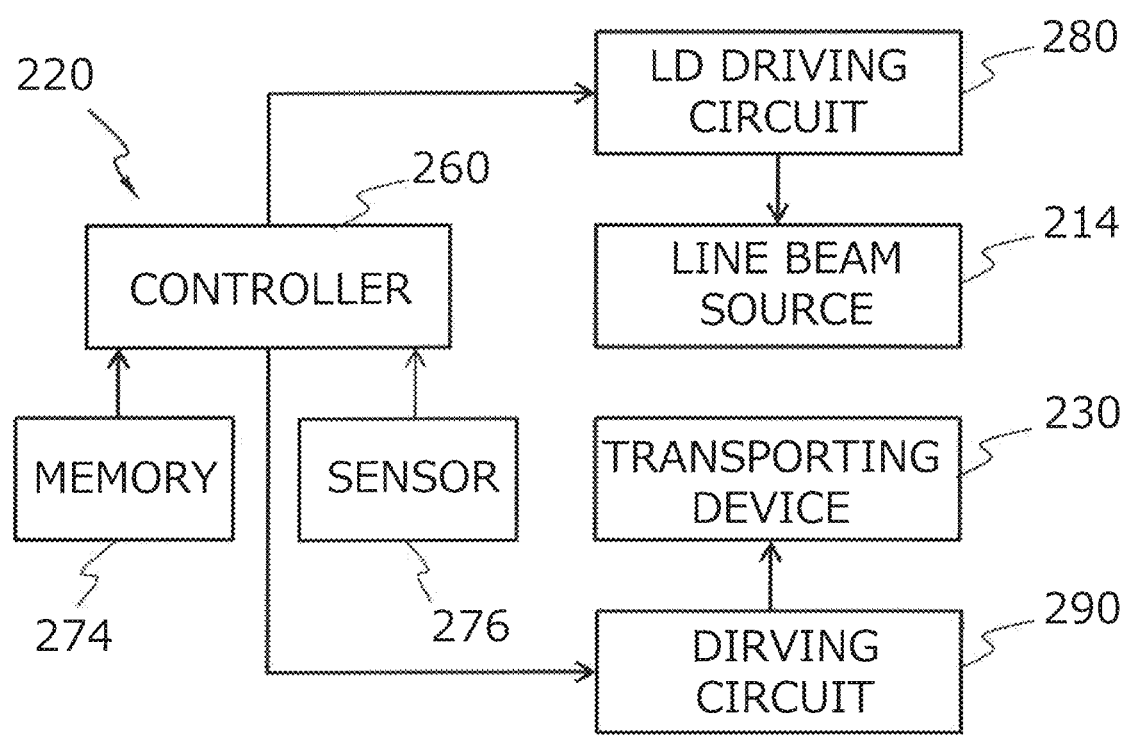
FIG. 5 is a block diagram schematically showing the flow of signals, data and instructions in the lift-off light irradiation unit.

Next, see FIG. 5. FIG. 5 is a block diagram schematically showing the flow of signals, data and instructions in the LLO unit 220.

The controller 260 is typically a computer. A part or the entirety of the controller 260 can be a general-purpose or special-purpose computer system. The computer system includes an OS (operating system) and, when necessary, hardware devices such as peripheral devices. The controller 260 is connected with a memory 274 which is a computer-readable storage medium. In the memory 274, a program is stored which defines the operation of the LLO unit 220.

In FIG. 5, for the sake of simplicity, a single memory unit is shown. However, the actual memory 274 can consist of a plurality of storage devices of an identical type or different types. A part of the memory 274 may be a nonvolatile memory while the other part may be a random access memory. A part or the entirety of the memory 274 may be an easily-detachable optical disc or solid-state recording element or may be a cloud-type storage on a net multilayer stack.

The controller 260 is connected with a sensor 276, such as temperature sensor and image sensor. Such a sensor 276 enables detection of the irradiation position of the line beam on the multilayer stack 100 or monitoring of a physical or chemical change in the multilayer stack 100 which can be caused by irradiation.

The controller 260 follows the program stored in the memory 274 and issues appropriate instructions to a laser driving circuit (LD driving circuit) 280 and a transporting device driving circuit 290, when necessary, based on the output of the sensor 276. The LD driving circuit 280 adjusts the irradiation intensity of the line beam emitted from the line beam source 214 according to the instruction from the controller 260. The transporting device driving circuit 290 adjusts the operation of the transporting device 230 according to the instruction from the controller 260.

The transporting device driving circuit 290 controls, for example, the rotation angle and the rotation speed of the motor in order to adjust the mutual positional relationship between the line beam source 214 and the stage 210. In this example, for the sake of simplicity, the line beam source 214 moves in the X-axis direction while the stage 210 is fixed, although the LLO unit of the present embodiment is not limited to this example. The stage 210 may move while the line beam source 214 is fixed. Alternatively, both the stage 210 and the line beam source 214 may move in an identical direction or in different directions. When the stage 210 moves while the stage 210 supports a heavy-weight multilayer stack 100, a bearing such as, for example, air slider can be used.

The line beam source 214 includes a plurality of arranged semiconductor laser devices. Each of the semiconductor laser devices is connected with a laser diode (LD) driving circuit 280. The LD driving circuit 280 receives an electric signal from the above-described photodiode for monitoring and adjusts the optical power of the semiconductor laser device to a predetermined level.

Semiconductor Laser Device

Figure 6:
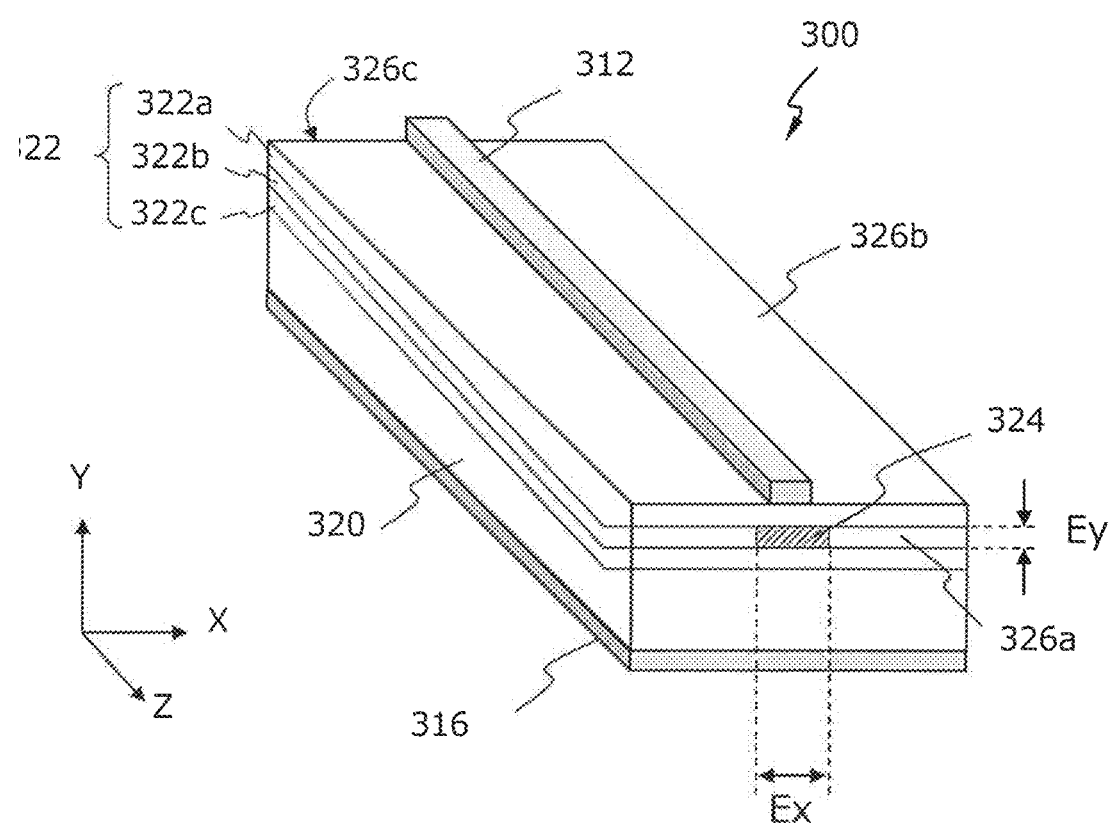
FIG. 6 is a perspective view schematically showing a basic configuration of a semiconductor laser device which can be used in a line beam source.

FIG. 6 is a perspective view schematically showing a basic configuration of a semiconductor laser device which can be used in the line beam source 214. The semiconductor laser device 300 shown in FIG. 6 includes a semiconductor multilayer stack 322 which has a facet 326a. The facet 326a includes an emission region (emitter) 324 from which laser light is to be emitted. In this example, the semiconductor multilayer stack 322 is supported on a semiconductor substrate 320 and includes a p-side cladding layer 322a, an active layer 322b, and an n-side cladding layer 322c. On the upper surface 326b of the semiconductor multilayer stack 322, a p-side electrode 312 in the shape of a stripe is provided. On the rear surface of the semiconductor substrate 320, an n-side electrode 316 is provided. When an electric current which is greater than a threshold flows through a predetermined region of the active layer 322b from the p-side electrode 312 to the n-side electrode 316, laser oscillation occurs. The facet 326a of the semiconductor multilayer stack 322 is covered with an unshown reflective film. Laser light is emitted from the emission region 324 via the reflective film.

In general, a size in the Y-axis direction of the emission region 324, Ey, is smaller than a size in the X-axis direction of the emission region 324, Ex. Thus, laser light emitted from the emission region 324 diverges (spreads) in the Y-axis direction due to a diffraction effect. According to the embodiment of the present disclosure, formation of a line beam can be realized by utilizing this diffraction effect. Note that an optical element, such as lens, diffraction element, slit, may be provided over the front surface of the emission region 324 for beam reshaping of the laser light.

The semiconductor laser device 300 can be made of various semiconductor materials and can have various configurations and sizes according to the oscillation wavelength and the optical power. When the laser light is required to have a wavelength in the ultraviolet region (e.g., 300-350 nm), the semiconductor multilayer stack 322 of the semiconductor laser device 300 can be suitably made of a nitride semiconductor, such as AlGaN-based semiconductor or InAlGaN-based semiconductor. The oscillation wavelength of the semiconductor laser device 300 can be set within the range of, for example, 200 nm to 350 nm. A ridge stripe may be provided in the p-side cladding layer 322a such that light confinement in the horizontal transverse direction is realized. The active layer 322b may include a single or a plurality of quantum well structures. The semiconductor multilayer stack 322 may include other semiconductor layers, such as a light guiding layer, a buffer layer, and a contact layer. When the substrate 320 is a sapphire substrate, the n-side electrode 316 is provided on a side of the substrate 320 on which the p-side electrode 312 is provided.

The configuration shown in FIG. 6 is merely a typical example of the configuration of the semiconductor laser device 300 and is simplified for the sake of simple description. This simplified configuration example does not limit embodiments of the present disclosure. The line beam can also be formed using a surface-emission type semiconductor laser device. Note that, in the other drawings, constituents such as the n-side electrode 316 will be omitted for the sake of simplicity.

Configuration Example of Line Beam Source

Figure 7A:
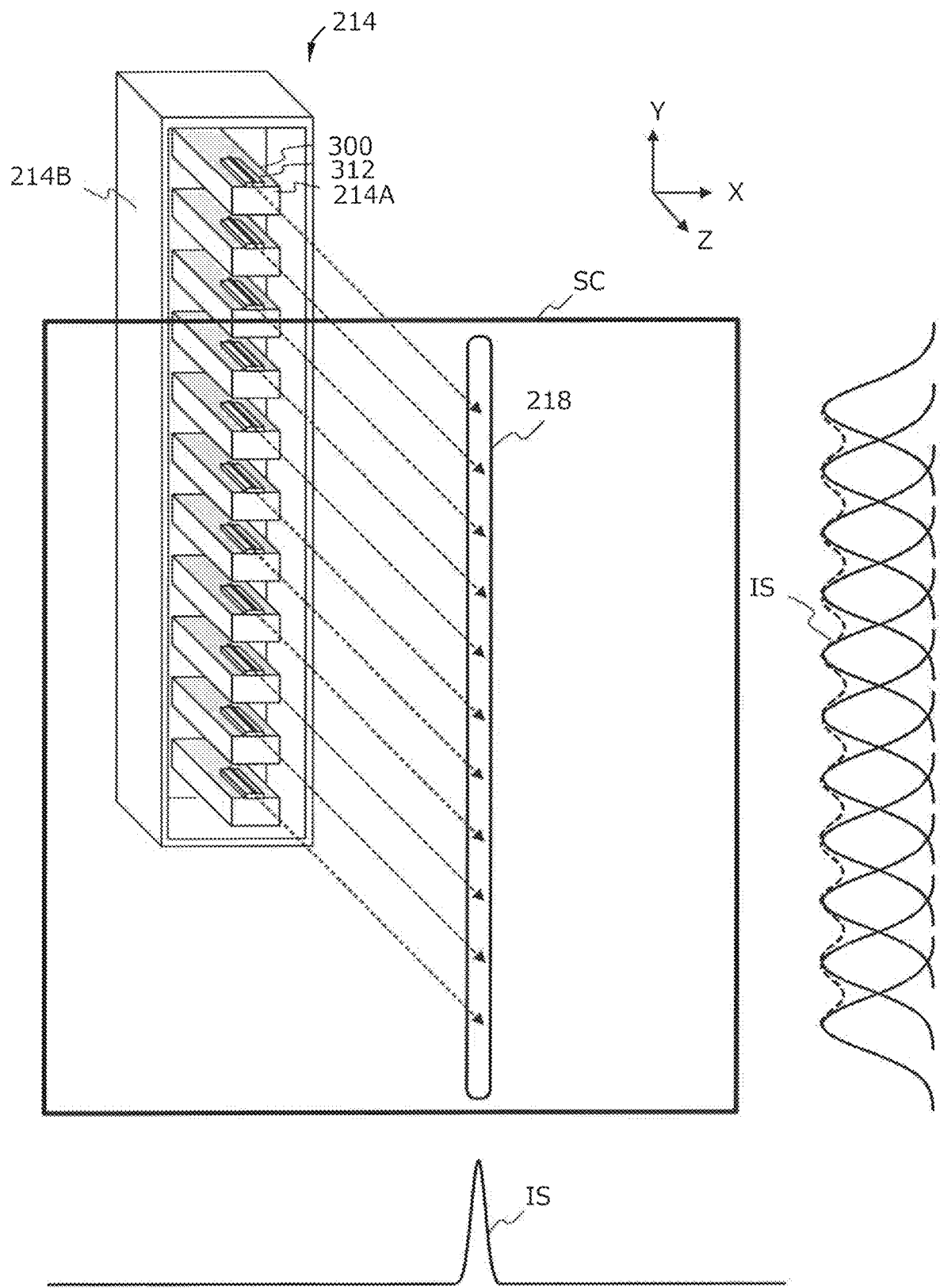
FIG. 7A is a diagram schematically showing a configuration example of a line beam source and an example of the light intensity distribution of laser light emitted from a semiconductor laser device during scanning.

See FIG. 7A. The line beam source 214 includes a plurality of semiconductor laser devices 300 and a plurality of supports 214A supporting the semiconductor laser devices 300. The semiconductor laser devices 300 and the supports 214A are held in a casing 214B. The supports 214A may be suitably made of a good conductor of high thermal conductivity, e.g., a metal such as copper or a ceramic material such as aluminum nitride. The casing 214B is closed with, for example, an unshown light-transmitting cover, whereby the inside of the casing 214B can be shielded from the atmosphere. The inside of the casing 214B is filled with, for example, a gas which is inert with the semiconductor laser devices 300. Each of the semiconductor laser devices 300 is supplied with electric power via an unshown wire (metal wire, metal ribbon, or the like). To suppress increase of the temperature of the semiconductor laser devices 300 during operation, a thermoelectric cooling device (not shown) such as Peltier device may be provided near the semiconductor laser devices 300. The supports 214A may include an internal channel for water cooling and fins for air cooling.

In each of the semiconductor laser devices 300, an unshown photodiode is provided near a facet 326c of the semiconductor laser device 300 which is opposite to the emission-side facet 326a. This facet 326c is covered with a reflective film which has a relatively-high reflectance. However, part of laser light oscillating inside the semiconductor laser device 300 leaks out from the facet 326c. This laser light leakage is detected by the photodiode, whereby the intensity of laser light emitted from the facet 326a can be monitored. The output of the photodiode is used for power control as previously described.

In the example of FIG. 7A, eleven semiconductor laser devices 300 are arranged along an identical line which is parallel to the Y-axis. The number of semiconductor laser devices 300 is not limited to this example but may be not more than ten or may be not less than twelve. The smallest number is four. To form a long line beam for irradiating a large-area region, more than 100 semiconductor laser devices 300 can be arranged on the same line. Each of the semiconductor laser devices 300 can have the same configuration as that of the semiconductor laser device 300 of FIG. 6. Laser light (lift-off light 216) emitted from the emission regions 324 of respective ones of the semiconductor laser devices 300 spread in parallel to the same line so as to form a line beam.

In FIG. 7A, a rectangular scanned surface SC which is parallel to the XY plane and an irradiation region 218 which is formed by laser light (lift-off light 216) on the scanned surface SC are schematically shown. The scanned surface SC is equivalent to the interface between the plastic film 30 and the glass base 10 in the multilayer stack 100.

For the sake of reference, FIG. 7A shows the X-axis direction distribution and the Y-axis direction distribution of the irradiation intensity IS in the irradiation region 218 at a certain time. The X-axis direction distribution of the irradiation intensity IS is narrow and unimodal. Meanwhile, the Y-axis direction distribution of the irradiation intensity IS has eleven peaks because laser light emitted from respective ones of the eleven semiconductor laser devices 300 overlap one another and extend in the shape of a line.

As previously described, laser light emitted from each of the semiconductor laser devices 300 has a tendency to spread in a predetermined direction (in this example, Y-axis direction) due to a diffraction effect. This characteristic is suitable to formation of a line beam extending in the Y-axis direction. Meanwhile, an optical element such as cylindrical lens may be used in order to suppress the divergence in the X-axis direction such that the irradiation energy in every second per unit area (irradiation intensity expressed in joule/cm$^2$) is increased. When such an optical element is used to focus the laser light in the X-axis direction, the width (the size in the X-axis direction) of the irradiation region 218 on the scanned surface SC can be narrowed to, for example, about 0.2 mm or smaller.

From the viewpoint of increasing the irradiation intensity of the line beam, it is preferred to decrease the arrangement pitch of the semiconductor laser devices 300 such that the number density of the semiconductor laser devices 300 is increased.

Figure 7B:
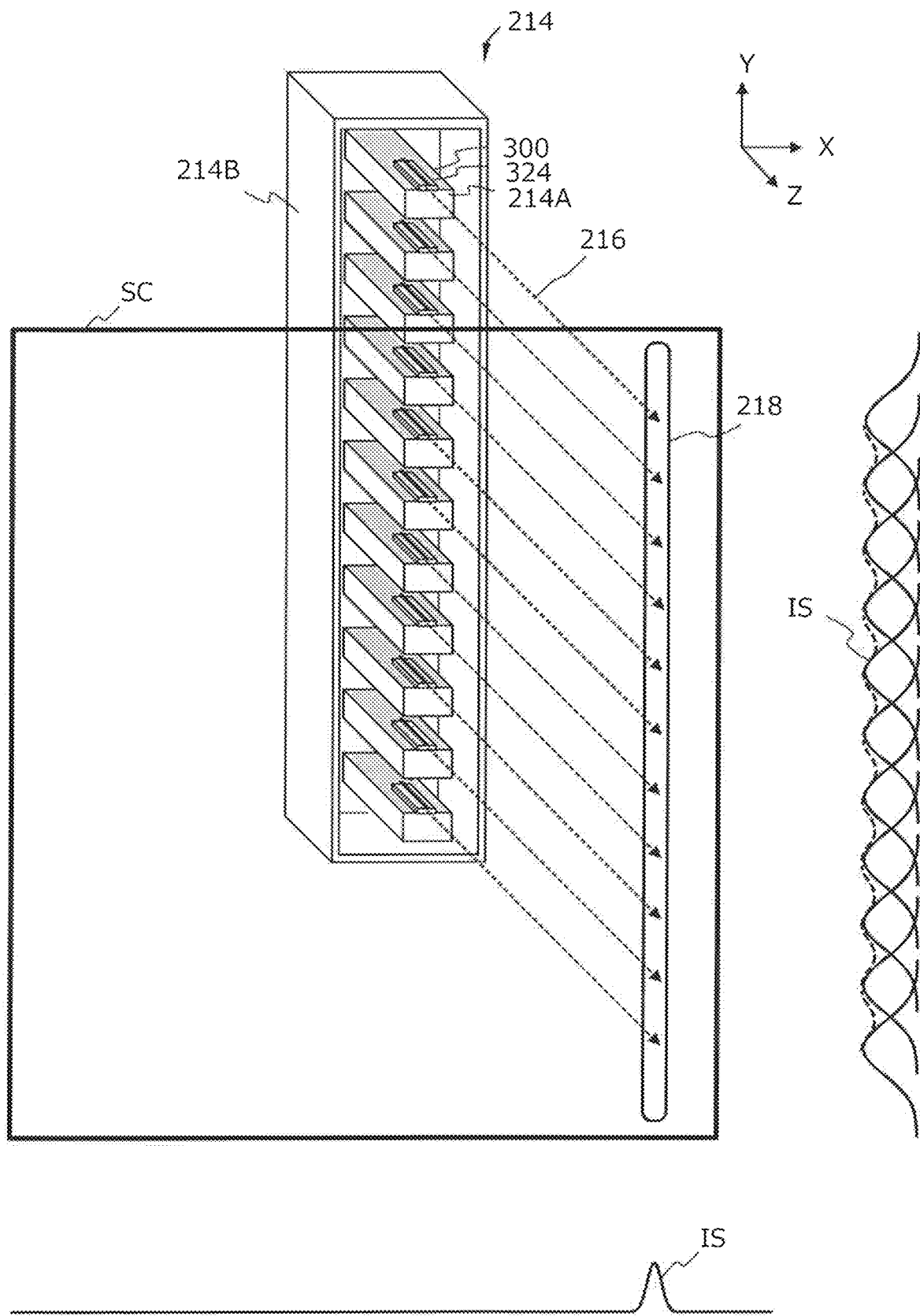
FIG. 7B is a diagram schematically showing a configuration example of a line beam source and another example of the light intensity distribution of laser light emitted from a semiconductor laser device during scanning.

Next, see FIG. 7B. FIG. 7B shows the line beam source 214 translated from the position shown in FIG. 7A in the positive direction of the X-axis. The irradiation region 218 is also translated according to the movement of the line beam source 214. In the state of FIG. 7B, the power of each of the semiconductor laser devices 300 is lower than that in the state of FIG. 7A. It is not necessary to increase or decrease the powers of respective ones of the semiconductor laser devices 300 at the same timing. In other words, not only the X-axis direction distribution of the irradiation intensity IS but also the Y-axis direction distribution can be variously changed during the scanning with the line beam.

By using the thus-arranged plurality of semiconductor laser devices 300, the power of the semiconductor laser devices 300 can be temporally and/or spatially modulated according to the position of the irradiation region 218. Thus, the distribution of the irradiation intensity across the scanned surface SC can be controlled.

Figure 8:
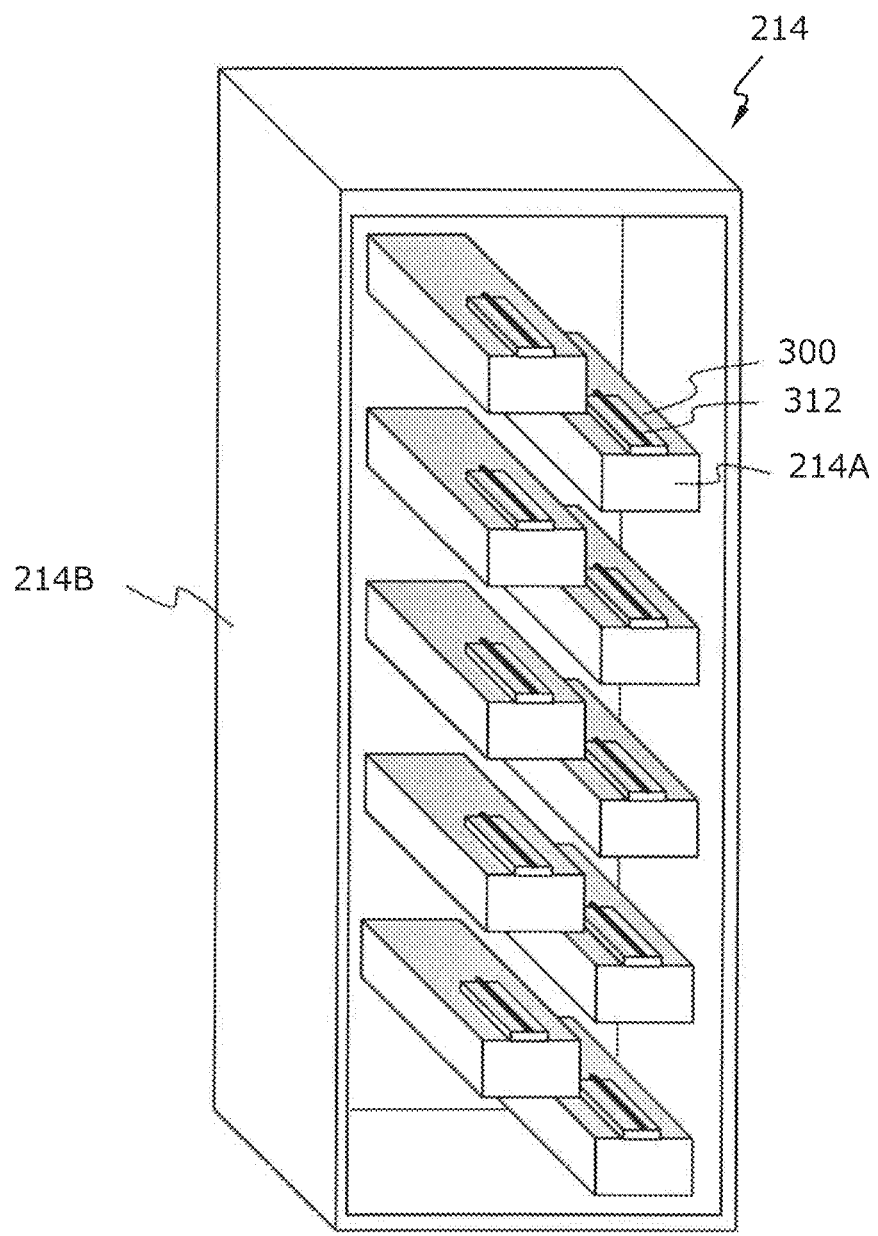
FIG. 8 is a perspective view schematically showing another configuration example of the line beam source.

FIG. 8 is a perspective view schematically showing another configuration example of the line beam source 214 that includes a plurality of semiconductor laser devices 300. In this example, the semiconductor laser devices 300 arranged in two rows have a stagger pattern (staggered arrangement). By reducing the distance between the centers of the two rows, a single line beam can be formed in total. When the orientation of the semiconductor laser devices 300 is adjusted such that the optical axes of the semiconductor laser devices 300 included in the first row and the optical axes of the semiconductor laser devices 300 included in the second row intersect with each other on the multilayer stack 100, substantially a single line beam can be formed.

According to the "line beam source" of the embodiment of the present disclosure, the irradiation region of the lift-off light does not need to be a single line. The irradiation region only needs to be continuously or discontinuously distributed in a direction transverse to the scanning direction. In other words, it is only necessary that the line beam source includes a plurality of light sources arranged along a line. The number of such lines is not limited to being singular but may be two or more.

Figure 9:
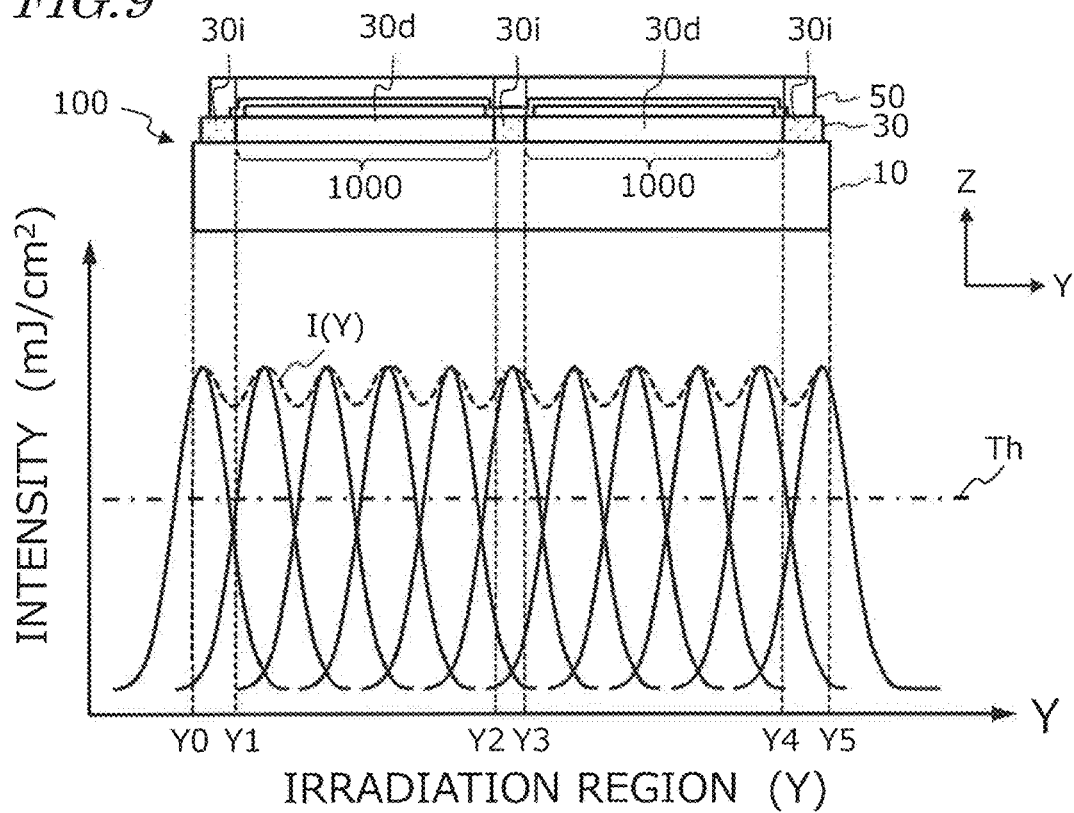
FIG. 9 is a diagram schematically showing an example of the distribution in the Y-axis direction of the irradiation intensity of the lift-off light.

Next, see FIG. 9. FIG. 9 is a diagram schematically showing an example of the distribution in the Y-axis direction of the irradiation intensity of the lift-off light 216. In the graph of FIG. 9, the horizontal axis represents the Y-axis coordinate of the irradiation region, and the vertical axis represents the irradiation intensity. The irradiation intensity is expressed by the energy density per unit area (e.g., [$mJ/cm^2$]). In the graph of FIG. 9, specific values of the irradiation intensity are not shown. The irradiation intensity refers to a value in the range of, for example, not less than 0 $mJ/cm^2$ and not more than 500 $mJ/cm^2$.

A curve shown by a broken line in the graph of FIG. 9 represents the distribution in the Y-axis direction of the irradiation intensity, I(Y). The Y-axis direction distribution I(Y) of the irradiation intensity is defined by overlapping of the light intensity distributions of laser light emitted from the plurality of semiconductor laser devices 300 of the line beam source 214 (e.g., FIG. 7A). The light intensity distribution of the laser light emitted from each of the semiconductor laser devices 300 can be reshaped using an optical element such as lens. The light intensity distribution shown in the drawing is merely exemplary. In FIG. 9, a straight dot-chain line represents threshold level Th of the irradiation intensity which is necessary for delamination. Threshold level Th is, for example, 250-300 $mJ/cm^2$. In a region irradiated with lift-off light at an irradiation intensity lower than this threshold level Th, the amount of lift-off light absorbed by the plastic film 30 is insufficient. Therefore, the plastic film 30 in that region remains bound, without being delaminated from the glass base 10.

In FIG. 9, a cross section of the multilayer stack 100 which is parallel to the YZ plane is shown above the graph for reference. The glass base 10 extends from position Y0 to position Y5. The OLED device 1000 on the left-hand side resides in the region extending from position Y1 to position Y2. The OLED device 1000 on the right-hand side resides in the region extending from position Y3 to position Y4. In other words, the flexible substrate regions 30*d* of the plastic film 30 correspond to the region extending from position Y1 to position Y2 and the region extending from position Y3 to position Y4. Meanwhile, the intermediate region 30*i* of the plastic film 30 corresponds to the region extending from position Y0 to position Y1, the region extending from position Y2 to position Y3, and the region extending from position Y4 to position Y5.

In the example of FIG. 9, the irradiation intensity distribution I(Y) of the lift-off light is higher than threshold level Th in a region larger than the region extending from position Y0 to position Y5. The irradiation intensity distribution I(Y) of the lift-off light needs to be higher than threshold level Th at least in the region extending from position Y1 to position Y2 and the region extending from position Y3 to position Y4. In other words, the interface between the flexible substrate regions 30*d* of the plastic film 30 and the glass base 10 needs to be irradiated with lift-off light whose irradiation intensity exceeds threshold level Th. In the present embodiment, the lift-off light is a line beam which is longer than the size in the Y-axis direction of the glass base 10. The smallest value of the irradiation intensity distribution I(Y) of the lift-off light during the scanning is typically 0 $mJ/cm^2$ but may be greater than 0 $mJ/cm^2$ so long as it is lower than threshold level Th.

When an amorphous semiconductor is heated and crystallized by irradiation with laser light in the shape of a line beam, the irradiation intensity distribution is desired to be uniform in order to achieve uniform crystallinity. On the other hand, when the delamination in the present embodiment is carried out, the irradiation intensity of the line beam does not need to be uniform so long as the irradiation intensity of the lift-off light at the interface which needs delamination exceeds threshold level Th.

Figure 10:
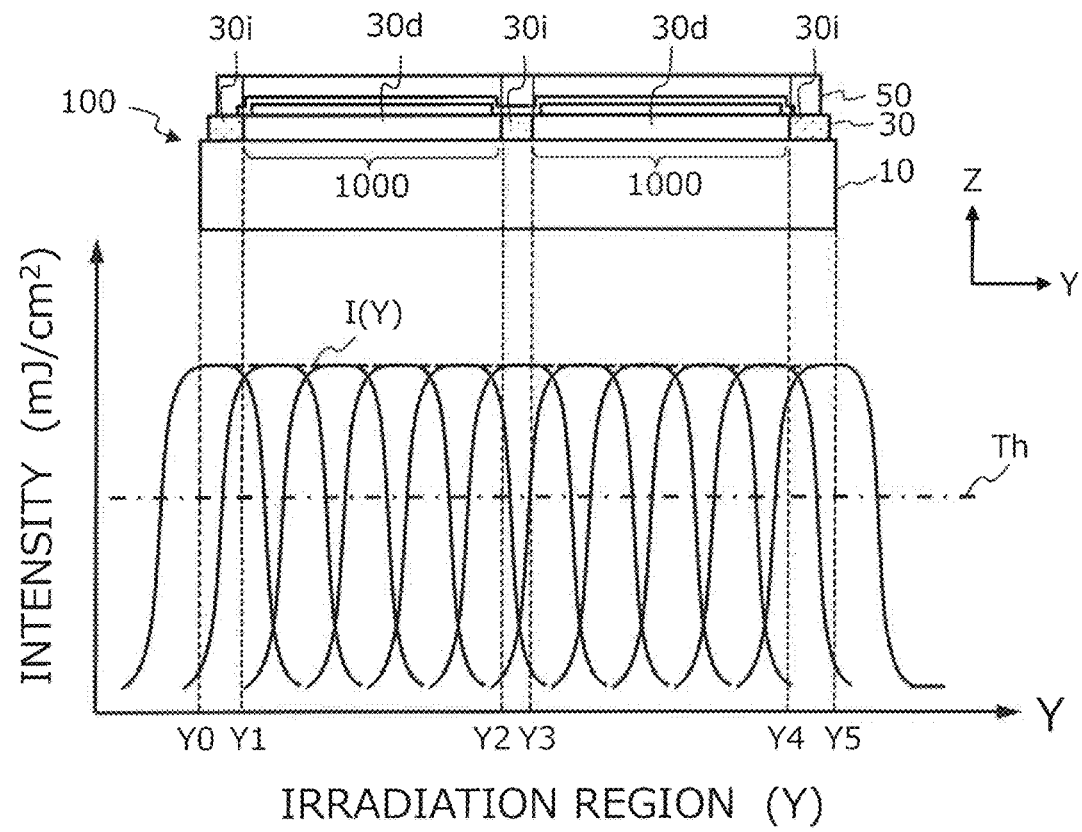
FIG. 10 is a diagram schematically showing another example of the distribution in the Y-axis direction of the irradiation intensity of the lift-off light.

In the example of FIG. 9, the irradiation intensity distribution I(Y) of the lift-off light has many peaks, although the embodiment of the present disclosure is not limited to such an example. For example, as illustrated in FIG. 10, part of the irradiation intensity distribution I(Y) of the lift-off light may be linear. In the example of FIG. 10, the light intensity distribution of laser light emitted from each of the semiconductor laser devices 300 of the line beam source 214 (e.g., FIG. 7A) is flat at the center of its optical axis, i.e., "top hat" type. If the irradiation intensity of the lift-off light at the interface which needs delamination exceeds threshold level Th as described above, the irradiation intensity of the line beam does not need to be uniform. Thus, the optical powers of the plurality of semiconductor laser devices 300 may be different from one another.

In the examples of FIG. 9 and FIG. 10, the interface between the intermediate region 30*i* of the plastic film 30 and the glass base 10 is also irradiated with lift-off light whose irradiation intensity exceeds threshold level Th. The interface between the intermediate region 30*i* of the plastic film 30 and the glass base 10 (e.g., the interface in the region extending from position Y0 to position Y1) may be irradiated with lift-off light whose irradiation intensity is lower than threshold level Th. This is because, in the middle of the operation of the line beam source 214, the irradiation intensity for the interface between the intermediate region 30*i* of the plastic film 30 and the glass base 10 can be temporarily decreased as will be described later.

The irradiation intensity distribution I(Y) of the lift-off light does not need to exceed threshold level Th in the region extending from position Y0 to position Y1, the region extending from position Y2 to position Y3, and the region extending from position Y4 to position Y5. These regions correspond to the interface between the intermediate region 30*i* of the plastic film 30 and the glass base 10. In the irradiation intensity distribution I(Y), the irradiation intensity of laser light for the interface between the intermediate region 30*i* of the plastic film 30 and the glass base 10 may be lower than the irradiation intensity of laser light for the interface between the flexible substrate regions 30*d* of the plastic film 30 and the glass base 10.

Figure 11:
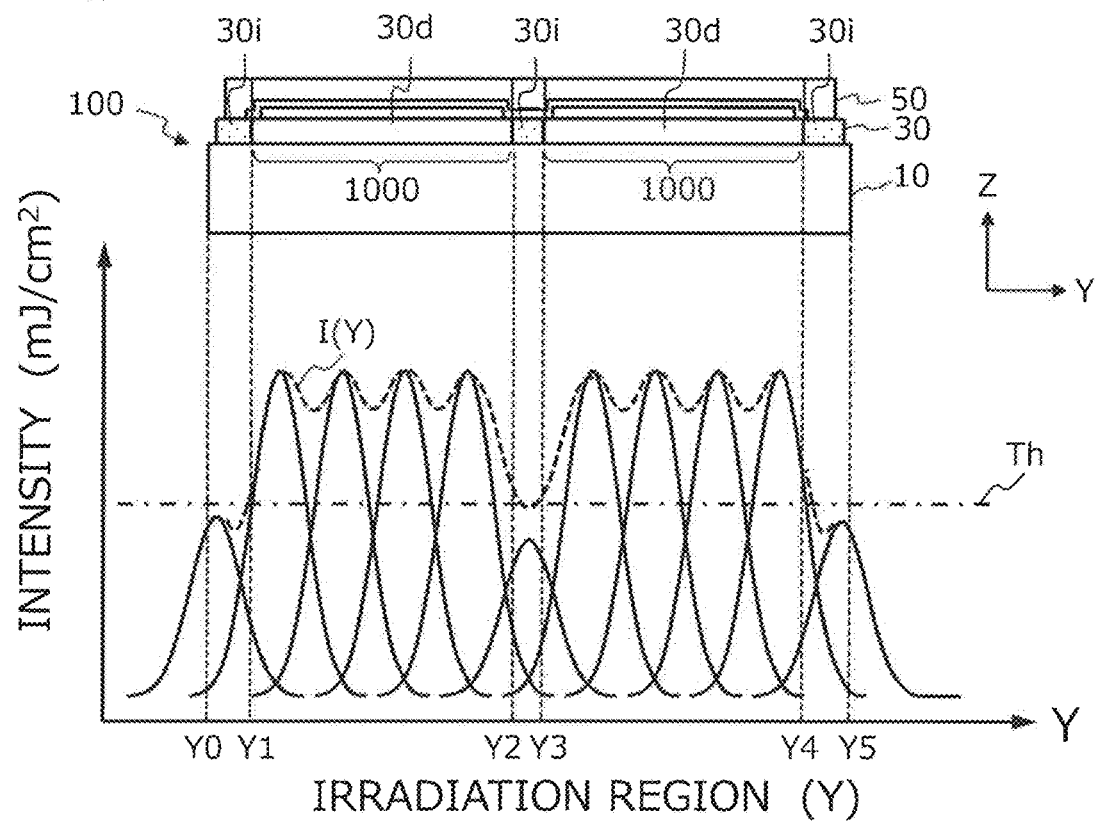
FIG. 11 is a diagram schematically showing still another example of the distribution in the Y-axis direction of the irradiation intensity of the lift-off light.
Figure 12:
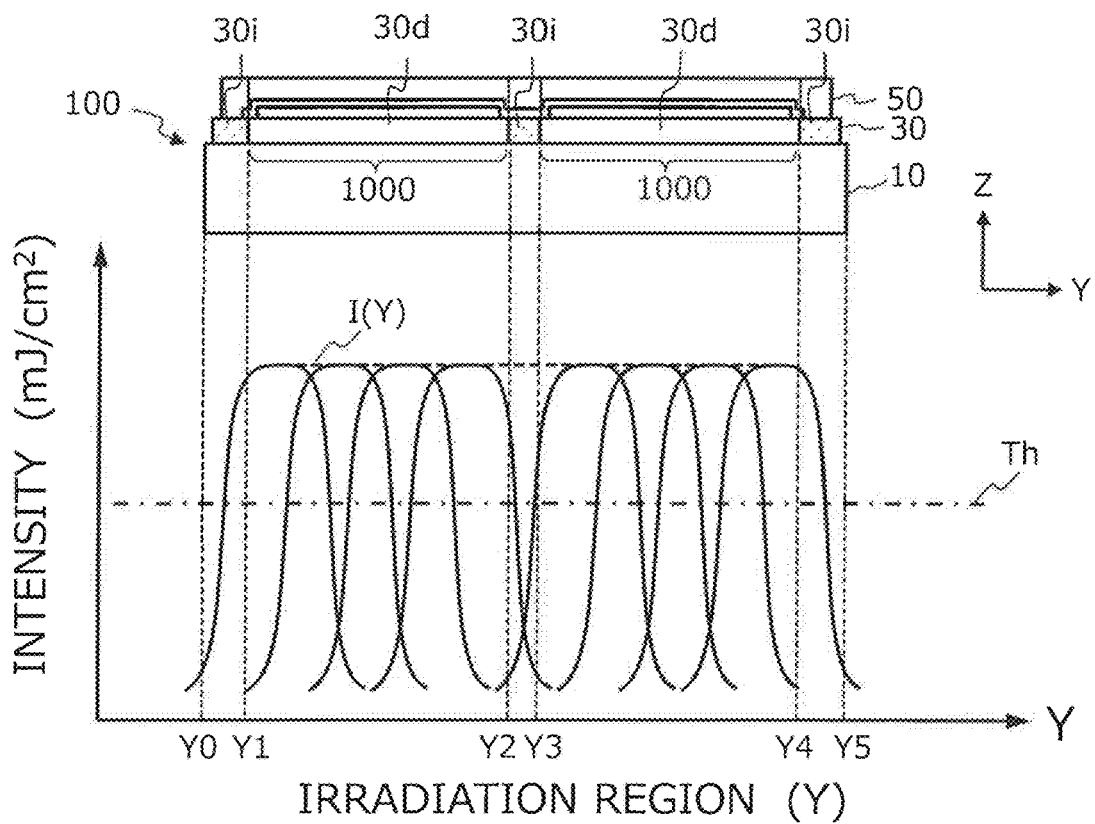
FIG. 12 is a diagram schematically showing still another example of the distribution in the Y-axis direction of the irradiation intensity of the lift-off light.

FIG. 11 and FIG. 12 show other examples of the Y-axis direction distributions I(Y) shown in FIG. 9 and FIG. 10, respectively.

In the example of FIG. 11, the powers of the semiconductor laser devices provided at opposite ends of the line beam source 214 and the semiconductor laser device provided at the center of the line beam source 214 are reduced, whereby the Y-axis direction distribution I(Y) is made lower than threshold level Th in the region extending from position Y0 to position Y1, the region extending from position Y2 to position Y3, and the region extending from position Y4 to position Y5.

In the example of FIG. 12, the emission of light from the semiconductor laser devices provided at opposite ends of the line beam source 214 and the semiconductor laser device provided at the center of the line beam source 214 is stopped, whereby the Y-axis direction distribution I(Y) is made lower than threshold level Th in the region extending from position Y0 to position Y1, the region extending from position Y2 to position Y3, and the region extending from position Y4 to position Y5.

According to the embodiment of the present disclosure, the line beam source 214 includes a plurality of laser light sources, and therefore, the irradiation intensity in the line beam can be spatially modulated by adjusting the power of each laser light source. Thus, the spatial distribution of the irradiation intensity which depends on the shape, size and arrangement of the flexible OLED devices 1000 of the multilayer stack 100 can be easily realized. If the type or design of the multilayer stack 100 to be produced is changed, the distribution of the irradiation intensity can be flexibly modulated.

A typical example of the laser light source is a semiconductor laser device, although the embodiment of the present disclosure is not limited to this example. When a semiconductor laser device is used, a small size, lightweight line beam source can advantageously be realized. However, when the multilayer stack 100 is moved during the scanning, each of a plurality of laser light sources may be a large laser device as compared with the semiconductor laser device. When the oscillation wavelength of the laser light source is out of a range suitable for delamination of the plastic film, the laser light may be converted to a harmonic wave using a wavelength converter.

Figure 13:
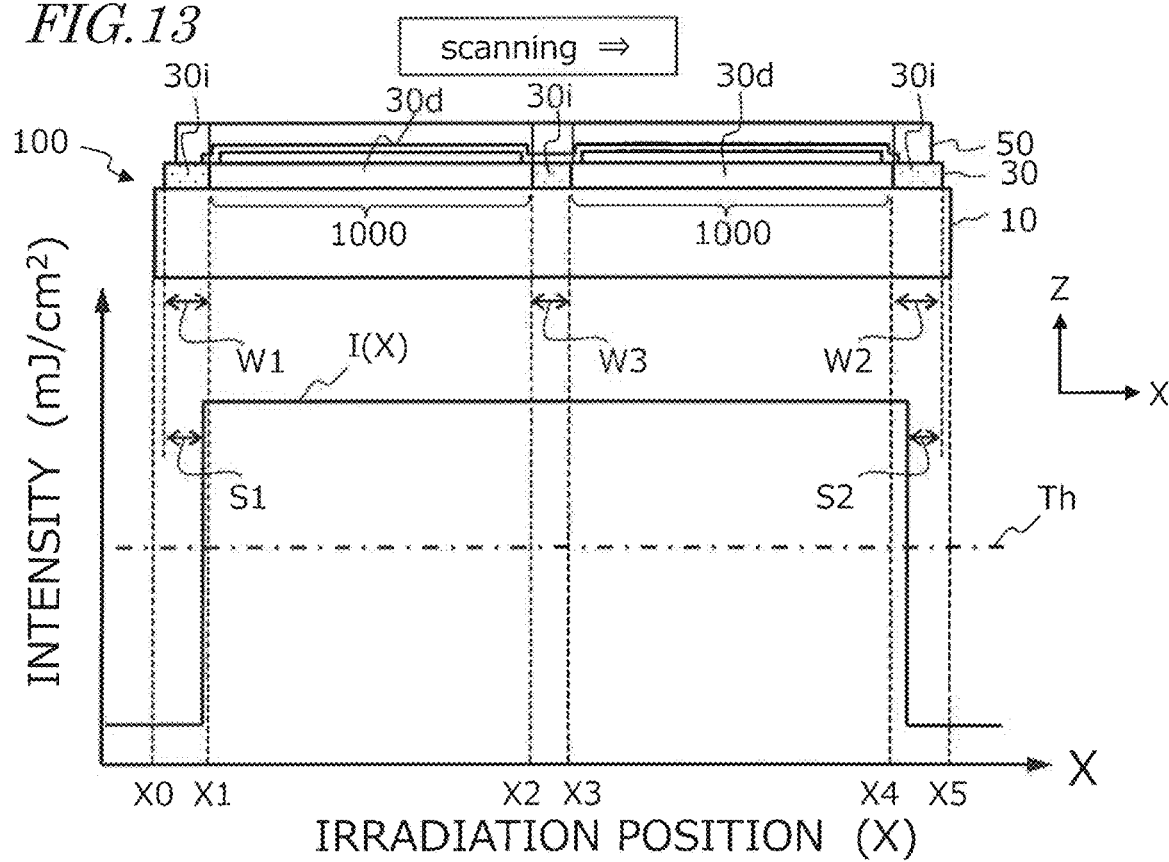
FIG. 13 is a diagram schematically showing an example of the distribution in the X-axis direction (scanning direction) of the irradiation intensity of the lift-off light.

Next, see FIG. 13. FIG. 13 is a diagram schematically showing an example of the distribution in the X-axis direction (scanning direction) of the irradiation intensity of the lift-off light 216. In the graph of FIG. 13, the horizontal axis represents the X-axis coordinate of the irradiation position, and the vertical axis represents the irradiation intensity. In the graph of FIG. 13, the solid line represents the X-axis direction distribution I(X) of the irradiation intensity, and a straight dot-chain line represents threshold level Th of the irradiation intensity which is necessary for delamination.

In FIG. 13, a cross section of the multilayer stack 100 which is parallel to the XZ plane is shown above the graph for reference. This cross section is perpendicular to the cross section of FIG. 9. The glass base 10 extends from position X0 to position X5. The OLED device 1000 on the left-hand side in the drawing resides in the region extending from position X1 to position X2. The OLED device 1000 on the right-hand side resides in the region extending from position X3 to position X4. In other words, the flexible substrate regions 30*d* of the plastic film 30 correspond to the region extending from position X1 to position X2 and the region extending from position X3 to position X4. Meanwhile, the intermediate region 30*i* of the plastic film 30 corresponds to the region extending from position X0 to position X1 (width: W1), the region extending from position X2 to position X3 (width: W3), and the region extending from position X4 to position X5 (width: W3). The intermediate region 30*i* at the left edge of the plastic film 30 in FIG. 13 (width: W1) includes a region in which the irradiation intensity is lower than threshold level Th (width: S1). Meanwhile, the intermediate region 30*i* at the right edge of the plastic film in FIG. 13 (width: W2) includes a region in which the irradiation intensity is lower than threshold level Th (width: S2). Here, W1>S1 and W2>S2 hold. It is preferred that width S1 is not less than 50% of width W1 and width S2 is not less than 50% of width W2.

The X-axis direction distribution I(X) of the irradiation intensity represents the whole scanning (sum or integral value) of the lift-off light. For example, while the irradiation position of the lift-off light (the position of the center line of the line beam) moves from position X0 to position X1, the region extending from position X1 to position X5 is not irradiated with the lift-off light. In this period, the irradiation intensity of the lift-off light in the region extending from position X1 to position X5 is, as a matter of course, zero.

The line width (the transverse axis dimension, the size in the X-axis direction) of the lift-off light 216 can be, for example, about 0.2 mm. This dimension defines the largeness of the irradiation region at the interface between the plastic film 30 and the glass base 10 at a certain time. The lift-off light 216 can be emitted in the form of a pulsed or continuous wave. Irradiation with the pulsed wave can be carried out at the frequency (the number of shots in one second) of, for example, about 200 times per second. When the lift-off light 216 is a pulsed wave, the scanning speed is determined such that two consecutive shots form partially-overlapping irradiation regions. If, for example, the line width (the transverse axis dimension, the size in the X-axis direction) of the lift-off light 216 is 0.2 mm and the irradiation position moves at 20 mm per second in the X-axis direction, a gap can occur between neighboring shots so long as the number of shots per second is less than 100. Therefore, the number of shots per second needs to exceed 100.

The positioning accuracy of the irradiation position depends on the mechanical forwarding accuracy of the line beam source 214. When the line width (the transverse axis dimension, the size in the X-axis direction) of the irradiation light 216 is, for example, 40 μm, moving the line beam source 214 stepwise at intervals of 20 μm can set the overlap of irradiation regions formed by two consecutive shots to 50%. Moving the line beam source 214 stepwise at intervals of 30 μm can set the overlap of irradiation regions formed by two consecutive shots to 75%. By controlling the overlap of irradiation regions, the irradiation intensity can also be changed without modulating the power of the laser light source.

When the irradiation position of the lift-off light is forwarded stepwise, "stepwise movement of the line beam source 214" and "pulsed irradiation with the lift-off light" can be repeated. In this case, irradiation with the lift-off light can be carried out while movement of the line beam source 214 relative to the stage 210 is stopped. In irradiation of a stationary object with laser light, adjustment of the irradiation intensity to a target value is easier than in irradiation of a moving object with laser light. For example, the irradiation intensity can be adjusted by increasing or decreasing the number of irradiation pulses or the irradiation duration at a stationary position. According to the embodiment of the present disclosure, a semiconductor laser device is used for the light source, and therefore, advantageously, the irradiation intensity can be easily controlled by adjusting the oscillation state of the semiconductor laser device.

When the moving speed (scanning speed) of the irradiation position is fixed to a predetermined value, the irradiation intensity can be modulated by increasing or decreasing the number of shots per second. On the contrary, when the number of shots per second is fixed, the irradiation intensity can be modulated by increasing or decreasing the moving speed (scanning speed) of the irradiation position. The irradiation intensity can also be modulated by changing the other parameters, e.g., the optical distance from the line beam source 214 to the multilayer stack 100. Also, a low irradiation region can be formed by providing a mechanical shutter between the line beam source 214 and the glass base 10 such that this shutter blocks the optical path of the lift-off light.

As seen from FIG. 13, in this example, the irradiation intensity of lift-off light for at least part of the interface between the intermediate region 30i of the plastic film 30 and the glass base 10 is lower than the irradiation intensity of lift-off light for the interface between the flexible substrate regions 30d of the plastic film 30 and the glass base 10. The region of this "at least part" may be referred to as "low irradiation region" or "non-delamination region". In the example of FIG. 13, the low irradiation region includes two parallel stripe regions extending along the perimeter of the glass base 10 (a region of width S1 and a region of width S2). The two stripe regions can be formed by irradiation with weak lift-off light 216 shown in FIG. 5A and FIG. 5D. In these two stripe regions, the irradiation intensity of the lift-off light 216 is lower than threshold level Th, and therefore, the intermediate region 30i of the plastic film 30 remains bound to the glass base 10.

Figure 14:
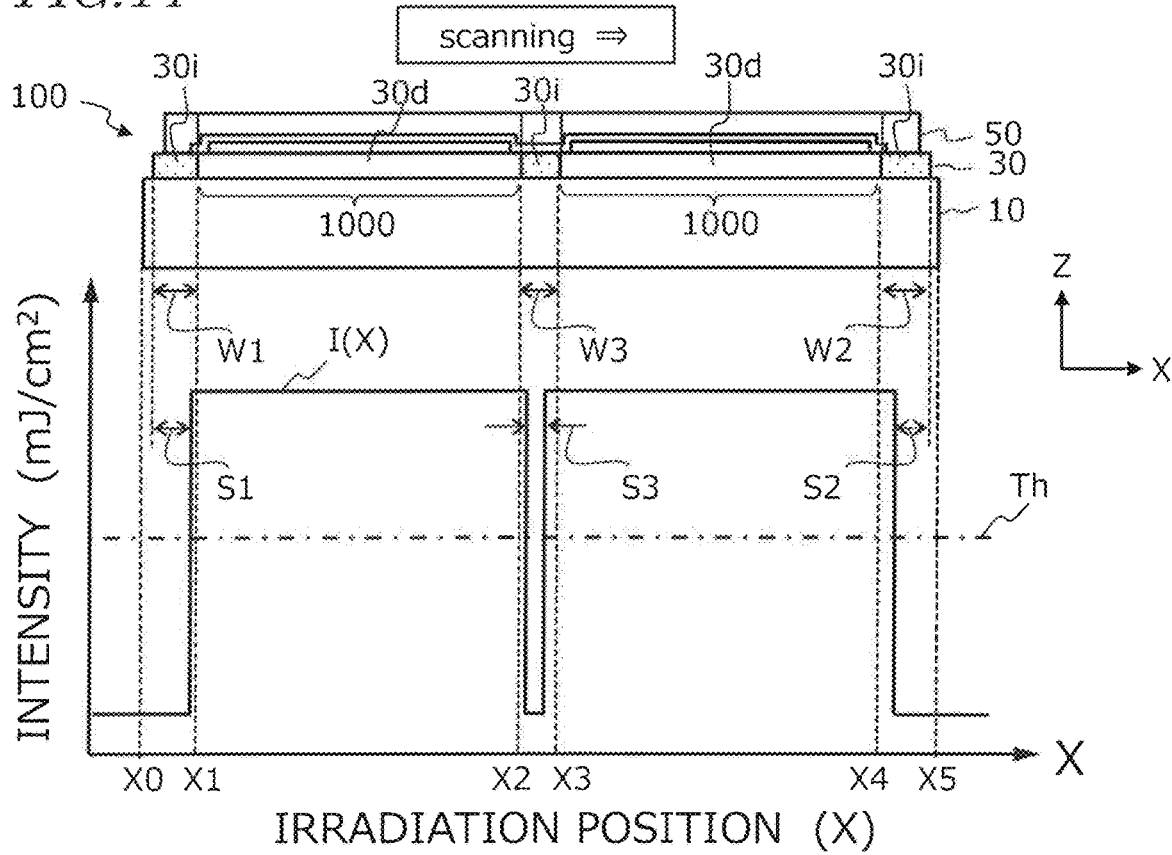
FIG. 14 is a diagram schematically showing another example of the distribution in the X-axis direction of the irradiation intensity of the lift-off light.

FIG. 14 shows an example where the irradiation intensity is temporarily lower than threshold level Th in the middle of the scanning with the lift-off light 216. Specifically, the irradiation intensity is lower than threshold level Th in part of the region extending from position X2 to position X3 (width: S3). In this example, the "low irradiation region" at the interface between the intermediate region 30i of the plastic film 30 and the glass base 10 includes not only the two stripe regions but also a single middle stripe region (width: S3) which is parallel to the two stripe regions. Each of widths S1, S2, S3 of these stripe regions is, for example, not less than 1 mm and, in a certain example, not less than 3 mm.

In the examples of FIG. 13 and FIG. 14, two OLED devices 1000 are arranged in the direction of the X-axis. When N is an integer not less than 3 and N OLED devices 1000 are arranged in the direction of the X-axis, the total number of stripes formed by the intermediate region 30i lying between two adjoining OLED devices 1000 is N−1. It is not necessary to provide a low irradiation region in all of the N−1 stripes. Alternatively, a plurality of low irradiation regions may be provided for an intermediate region 30i which forms a single stripe.

Figure 15A:
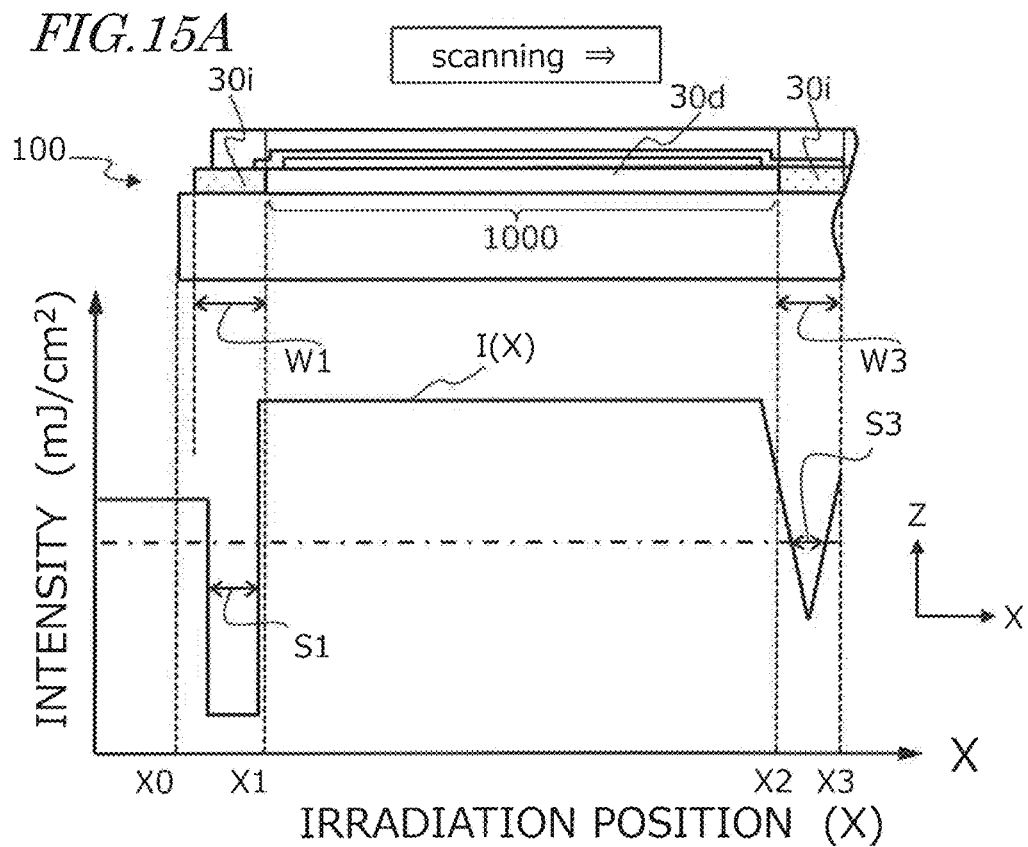
FIG. 15A is a diagram schematically showing still another example of the distribution in the X-axis direction of the irradiation intensity of the lift-off light.
Figure 15B:
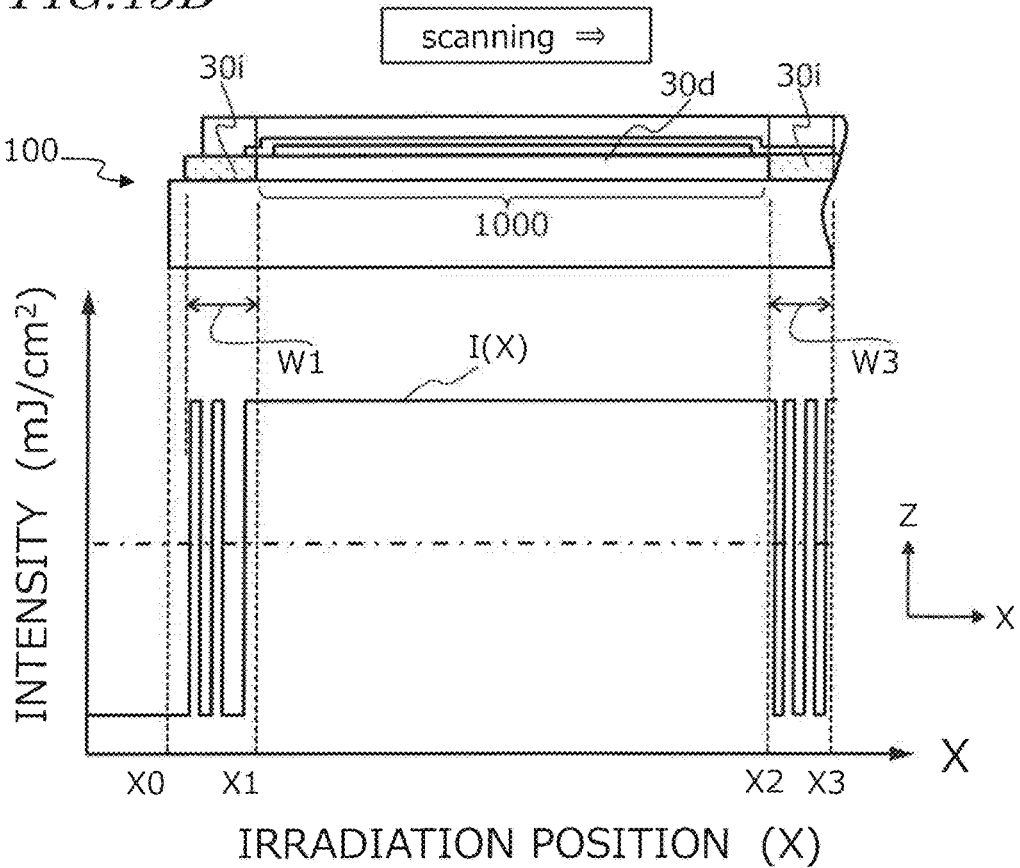
FIG. 15B is a diagram schematically showing still another example of the distribution in the X-axis direction of the irradiation intensity of the lift-off light.

In the examples of FIG. 13 and FIG. 14, the low irradiation region of width S1 and the low irradiation region of width S2 each reach the perimeter of the plastic film 30, although the embodiment of the present disclosure is not limited to this example. For example, the low irradiation region can be in various forms as shown in FIG. 15A and FIG. 15B. FIG. 15A and FIG. 15B are diagrams schematically showing still other examples of the distribution in the X-axis direction of the irradiation intensity of the lift-off light. In these drawings, examples of the modulation pattern of the irradiation intensity at the interface between the intermediate region 30i surrounding the OLED device 1000 on the left-hand side of FIG. 13 and the glass base 10 are shown.

In the example shown in FIG. 15A, the striped low irradiation regions (width: S1) extending along the perimeter of the plastic film 30 do not reach the perimeter of the plastic film 30. The irradiation intensity of the lift-off light may exceed threshold level Th before the glass base 10 is irradiated with the lift-off light. As in the region extending from position X1 to position X3 shown in FIG. 15A, the irradiation intensity may gradually change. When the irradiation intensity gradually changes, the width (the size in the scanning direction) of the "low irradiation region" can be defined as the width of a region in which the irradiation intensity is lower than threshold level Th.

In the example shown in FIG. 15B, the low irradiation region consists of a plurality of stripes which have a relatively narrow width. When the lift-off light is, for example, pulsed light, such a low irradiation region can be realized by applying consecutive shots such that irradiation regions do not overlap each other.

To maintaining at least part of the intermediate region 30i of the plastic film 30 bound to the glass base 10 by relatively decreasing the irradiation intensity, it is desirable that the irradiation intensity in the "at least part" is lower than threshold level Th. However, even if it is not lower than threshold level Th, the intermediate region 30i is likely to remain on the glass base 10 so long as an irradiation intensity which is lower than the irradiation intensity in a region to be delaminated is realized. If the difference between the irradiation intensity in a region to be delaminated and the irradiation intensity in the low irradiation region is not less than 50 mJ/cm$^2$, a sufficient effect is achieved.

In the present embodiment, the lift-off light is a line beam extending in a direction parallel to the perimeter of the glass base 10 (first direction), and the scanning direction is the second direction which is perpendicular to the first direction. However, the first direction and the second direction do not need to be perpendicular to each other but only need to be transverse to each other.

In the above-described example, as previously described with reference to FIG. 4, the position of the line beam source 214 is moved while the stage 210 is fixed, whereby the irradiation position of the lift-off light is moved (scanning). However, the embodiment of the present invention is not limited to this example. Scanning with the lift-off light may be carried out by moving the stage 210 while the line beam source 214 is fixed. Alternatively, scanning with the lift-off light may be carried out by moving both the line beam source 214 and the stage 210.

Lift-Off

Figure 16A:
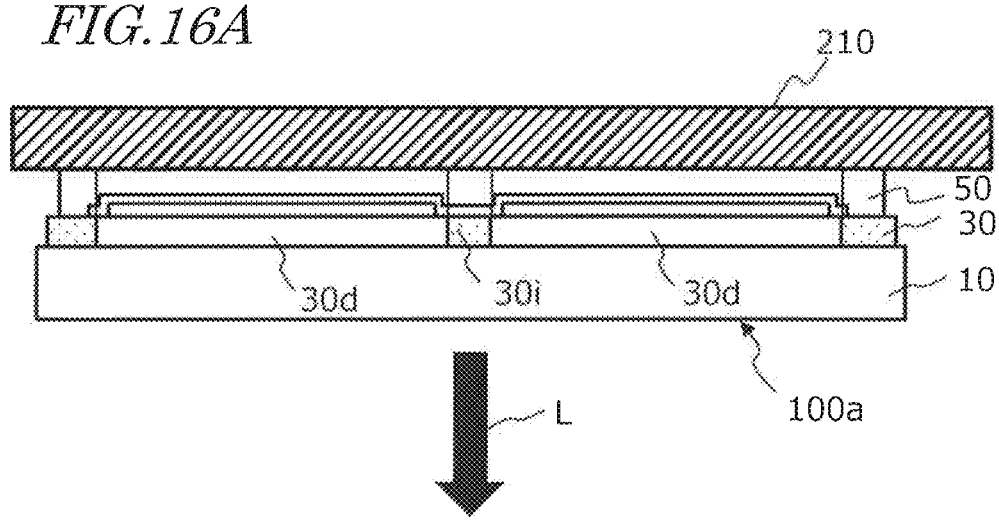
FIG. 16A is a cross-sectional view schematically showing the multilayer stack before the multilayer stack is separated into the first portion and the second portion after irradiation with lift-off light.

FIG. 16A illustrates a state where the multilayer stack 100 is in contact with the stage 210 after irradiation with the lift-off light. While this state is maintained, the distance from the stage 210 to the glass base 10 is increased. At this point in time, the stage 210 of the present embodiment holds an OLED device portion of the multilayer stack 100.

An unshown actuator holds the glass base 10 and moves the entirety of the glass base 10 in the direction of arrow L, thereby carrying out delaminating (lift-off). The glass base 10 can be moved together with an unshown chuck stage while being adhered by suction to the chuck stage. The direction of movement of the glass base 10 does not need to be vertical, but may be diagonal, to the first surface 100a of the multilayer stack 100. The movement of the glass base does not need to be linear but may be rotational. Alternatively, the stage 210 may be moved upward in the drawing while the glass base 10 is secured by an unshown holder or another stage.

Figure 16B:
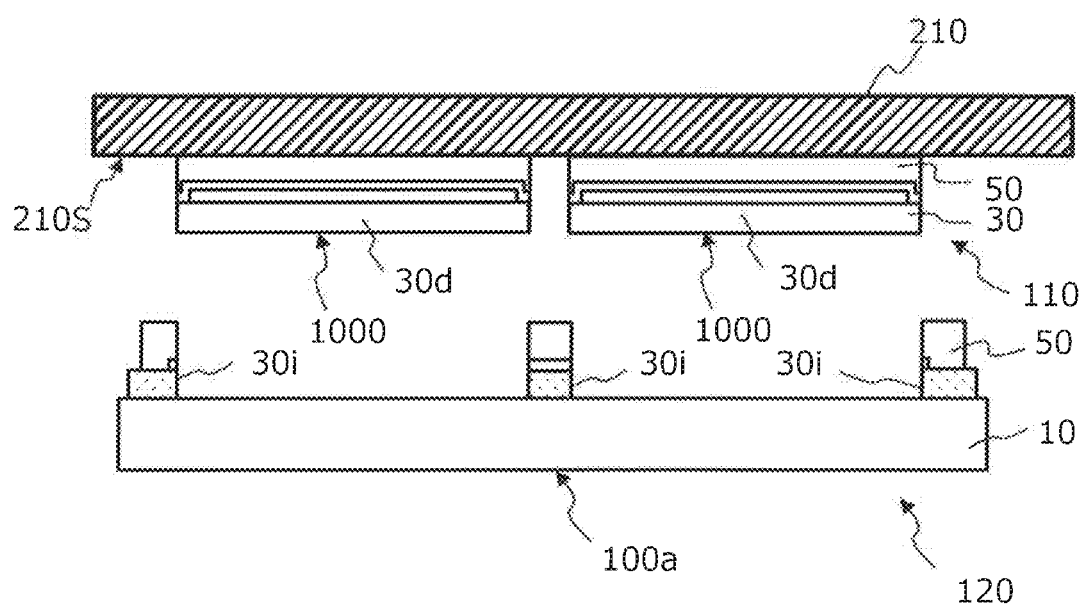
FIG. 16B is a cross-sectional view schematically showing the multilayer stack separated into the first portion and the second portion.
Figure 17:
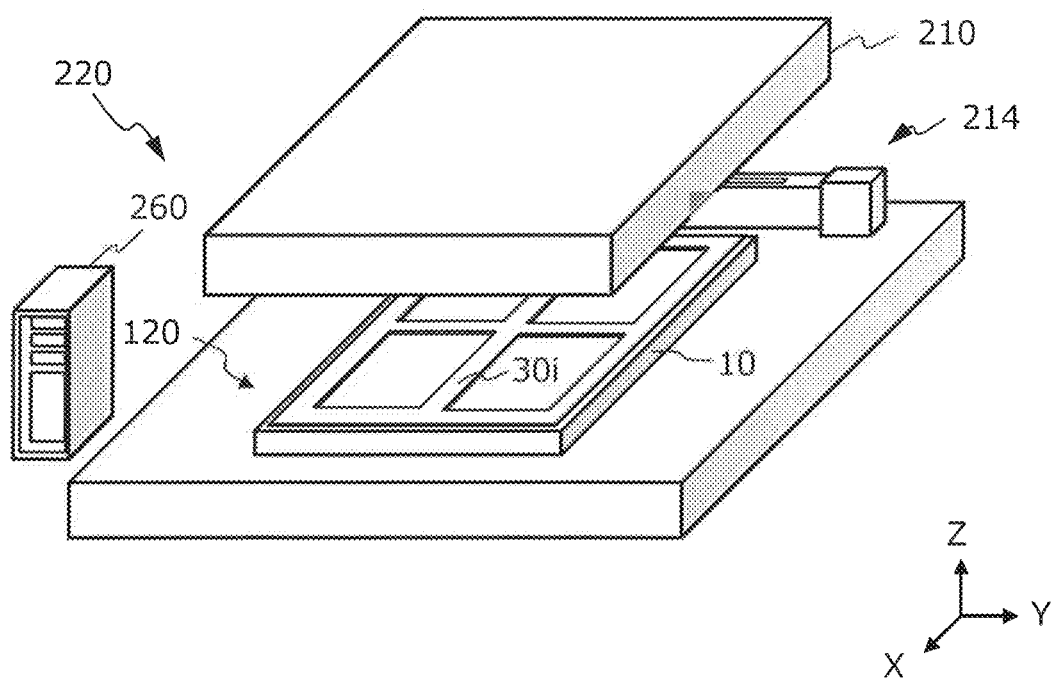
FIG. 17 is a perspective view showing the glass base separated from the multilayer stack by an LLO unit.

FIG. 16B is a cross-sectional view showing the thus-separated first portion 110 and second portion 120 of the multilayer stack 100. FIG. 17 is a perspective view showing the second portion 120 of the multilayer stack 100. In FIG. 17, a guide rail 246 and other relevant components are not shown. The first portion 110 of the multilayer stack 100 includes a plurality of OLED devices 1000 which are in contact with the stage 210. The respective OLED devices 1000 include the functional layer regions 20 and the plurality of flexible substrate regions 30d of the plastic film 30. Meanwhile, the second portion 120 of the multilayer stack 100 includes the glass base 10 and the intermediate region 30i of the plastic film 30. The intermediate region 30i of the plastic film 30 is bound to the glass base 10 in at least some low-irradiation regions. Thus, the entirety of the intermediate region 30i of the plastic film 30 separates from the stage 210 while the entirety of the intermediate region 30i is kept adhered to the glass base 10.

In the example of FIG. 17, both the irradiation process with the lift-off light and the delaminating process are carried out using the LLO unit 220 that includes the stage 210. The embodiment of the present disclosure is not limited to this example. The irradiation process with the lift-off light may be carried out using a lift-off light irradiation unit which includes the stage 210, while the delaminating process is carried out using a different apparatus that includes another stage which is different from the stage 210. In this case, after irradiation with the lift-off light, it is necessary to transfer the multilayer stack 100 from the stage 210 to another unshown stage. When the same stage is used for carrying out both the irradiation process with the lift-off light and the delaminating process, the step of transferring the multilayer stack between the stages can be omitted.

As described above, in the present embodiment, the step of separating the multilayer stack 100 into the first portion 110 and the second portion 120 is carried out while the stage 210 holds the second surface 100b of the multilayer stack 100 by suction. The essence of this separation step resides in that an unnecessary part of the multilayer stack 100 which is not a constituent of the OLED device 1000 separates together with the glass base 10 from the stage 210. In the present embodiment, the cutting step illustrated in FIG. 2, i.e., the step of cutting a part of the multilayer stack 100 exclusive of the glass base 10 into the plurality of OLED devices 1000 and the remaining unnecessary portions, is carried out before irradiation with the lift-off light. Carrying out the cutting step before the lift-off light irradiation step is effective in realizing the separation illustrated in FIG. 16B and FIG. 17.

Steps after Delaminating

Figure 18:
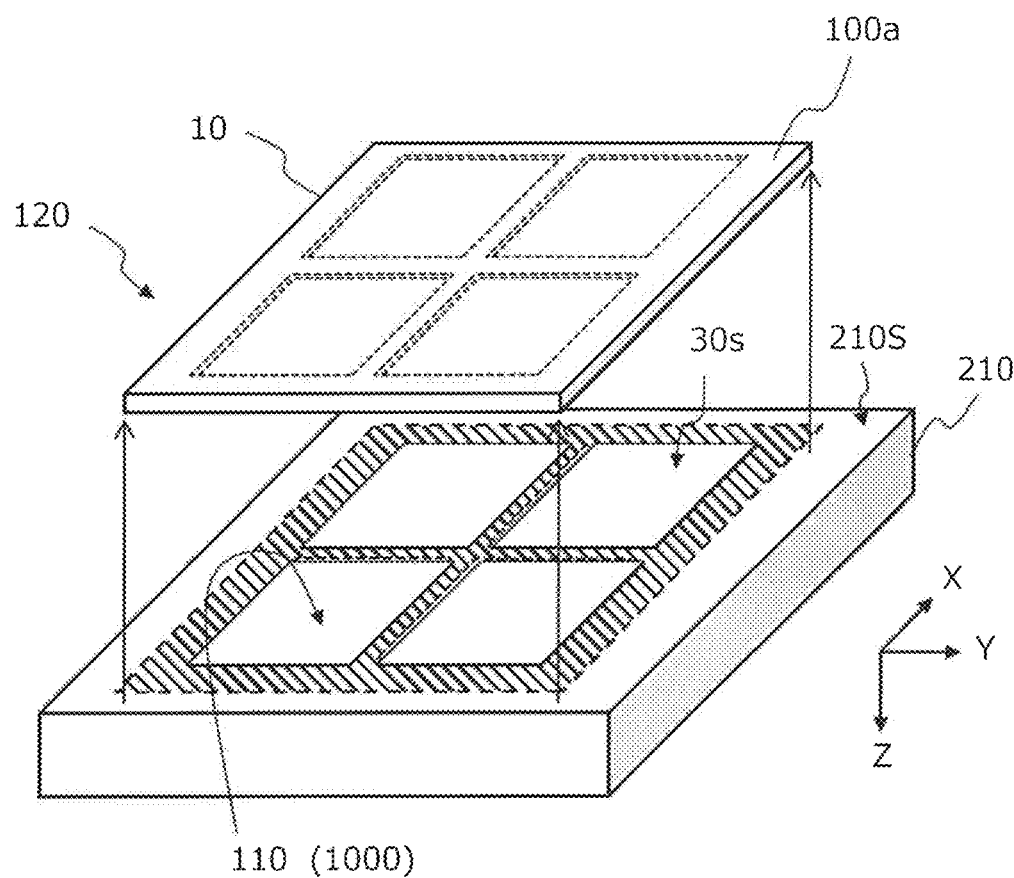
FIG. 18 is a perspective view showing removal of the glass base from the stage.

FIG. 18 is a perspective view showing the first portion 110 (OLED devices 1000) of the multilayer stack 100 adhered by suction to the stage 210 and the second portion 120 (the glass base 10 and objects bound thereto) at a position distant from the stage 210. Unnecessary portions of the multilayer stack 100 which are not constituents of the OLED devices 1000 are bound to the glass base 10.

Figure 19:
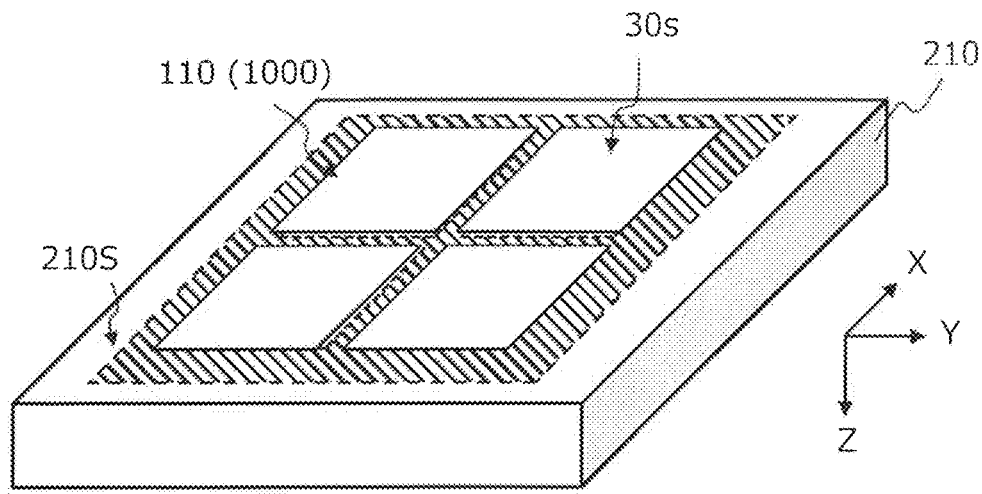
FIG. 19 is a perspective view showing the stage from which the glass base has been removed.

FIG. 19 is a perspective view showing the first portion 110 of the multilayer stack 100 adhered by suction to the stage 210. The first portion 110 of the multilayer stack 100 supported by the stage 210 includes a plurality of OLED devices 1000 arrayed in rows and columns. In the example of FIG. 19, a part of the plastic film 30, specifically the surface (delaminated surface) 30s of the flexible substrate regions 30d, is exposed.

Figure 20:
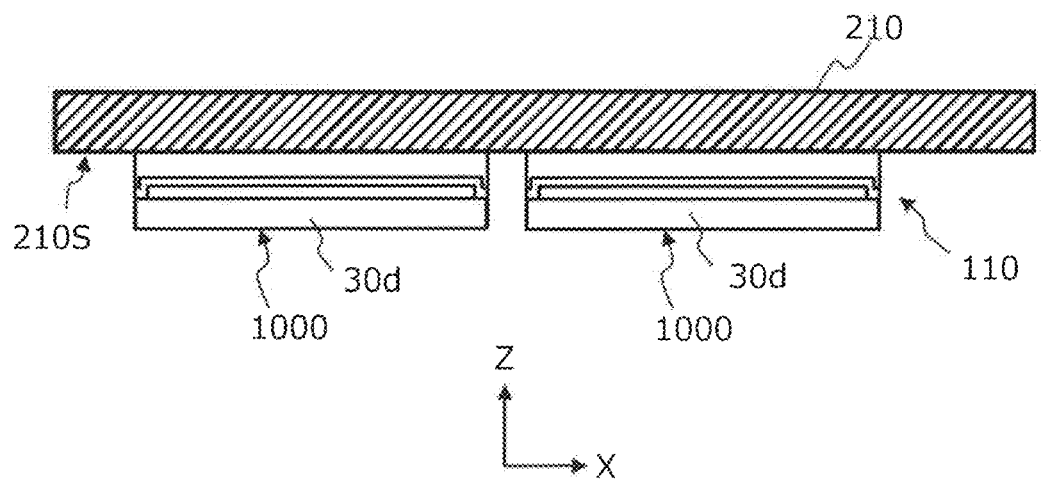
FIG. 20 is a cross-sectional view showing the stage from which the glass base has been removed.

FIG. 20 is a cross-sectional view showing that the stage 210 holds the OLED devices 1000 by suction. This cross section is parallel to the ZX plane. The direction of the Z-axis of FIG. 20 is opposite to the direction of the Z-axis of FIG. 18 and FIG. 19.

Various processes can be sequentially or concurrently performed on the plurality of OLED devices 1000 which are in contact with the stage 210.

The "processes" to be performed on the OLED devices 1000 can include attaching a dielectric and/or electrically-conductive film to each of the plurality of OLED devices 1000, cleaning or etching each of the plurality of OLED devices 1000, and mounting an optical part and/or an electronic part to each of the plurality of OLED devices 1000. Specifically, a part such as, for example, a polarizer, encapsulation film, touchscreen, heat radiation sheet, electromagnetic shield, driver integrated circuit, or the like, can be mounted to the flexible substrate region 30d of each of the OLED devices 1000. The sheet-like part includes a functional film which can add an optical, electrical or magnetic function to the OLED devices 1000.

The plurality of OLED devices 1000 are supported by the stage 210 such that the OLED devices 1000 are adhered by suction to the stage 210. The various processes which are to be performed on each of the OLED devices 1000 can be efficiently carried out.

The surface 30s of the plastic film 30 delaminated from the glass base 10 is active. Therefore, the surface 30s may be covered with a protection film or subjected to a surface treatment for conversion to a hydrophobic surface before various parts are mounted to the surface 30s.

Figure 21:
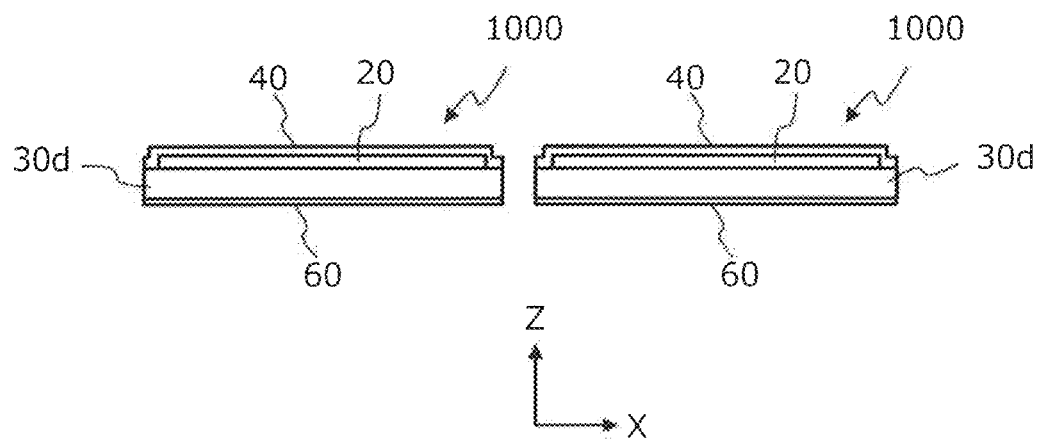
FIG. 21 is a cross-sectional view showing flexible OLED devices detached from the stage.

FIG. 21 is a cross-sectional view schematically showing the OLED devices 1000 detached from the stage 210 after the sheet-like part (functional film) 60 is mounted to the OLED devices 1000.

According to the prior art, the plastic film is delaminated from the glass base before the OLED devices 1000 are divided from one another. Therefore, when a subsequent process is carried out, a large number of OLED devices 1000 are bound to a single plastic film. Thus, it is difficult to carry out an efficient process on each of the OLED devices 1000. When the OLED devices 1000 are divided from one another after the sheet-like part is attached, a portion of the sheet-like part which is present in an intermediate region between adjoining two of the OLED devices 1000 is useless.

On the other hand, according to the embodiment of the present disclosure, a large number of OLED devices 1000 are still orderly arrayed on the stage 210 after being delaminated from the glass base 10. Therefore, various processes can be efficiently performed on the OLED devices 1000 sequentially or concurrently.

After the step of separating the multilayer stack 100 into the first portion 110 and the second portion 120, the step of adhering another protection sheet (second protection sheet)

Figure 22:
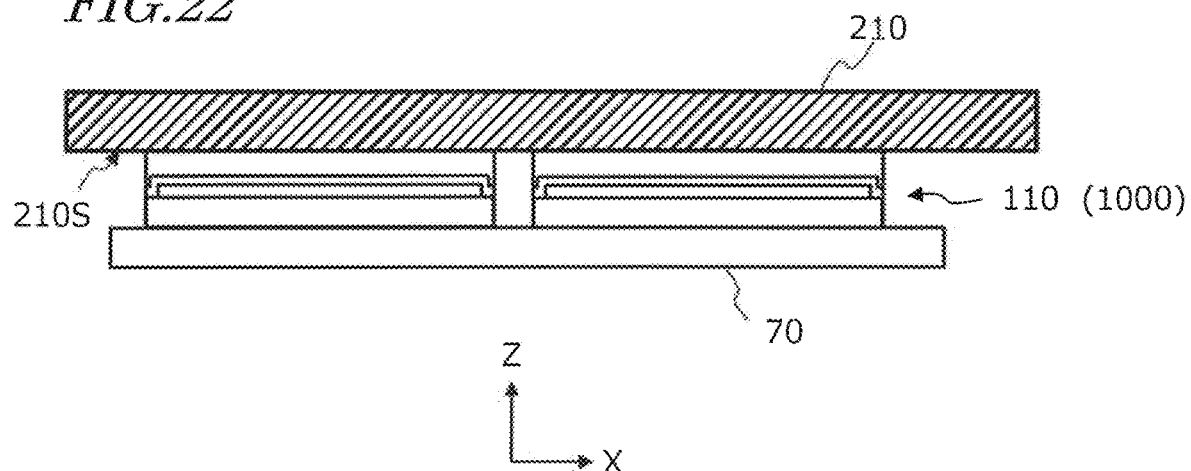
FIG. 22 is a cross-sectional view showing another protection sheet bound to a plurality of OLED devices which are in contact with the stage.

70 to the plurality of OLED devices 1000 which are in contact with the stage 210 may be further performed as shown in FIG. 22. The second protection sheet can perform the function of temporarily protecting the surface of the flexible substrate regions 30d of the plastic film 30 delaminated from the glass base 10. The second protection sheet 70 can have the same laminate structure as that of the previously-described protection sheet 50. The protection sheet 50 can be referred to as "first protection sheet 50".

The second protection sheet 70 may be adhered to the plurality of OLED devices 1000 after various processes which have previously been described are performed on the plurality of OLED devices 1000 which are in contact with the stage 210.

When suction of the OLED devices 1000 by the stage 210 is stopped after the second protection sheet 70 is adhered, the plurality of OLED devices 1000 which are bound to the second protection sheet 70 can be detached from the stage 210. Thereafter, the second protection sheet 70 can function as a carrier for the plurality of OLED devices 1000. This is transfer of the OLED devices 1000 from the stage 210 to the second protection sheet 70. Various processes may be sequentially or concurrently performed on the plurality of OLED devices 1000 which are bound to the second protection sheet 70.

Figure 23:
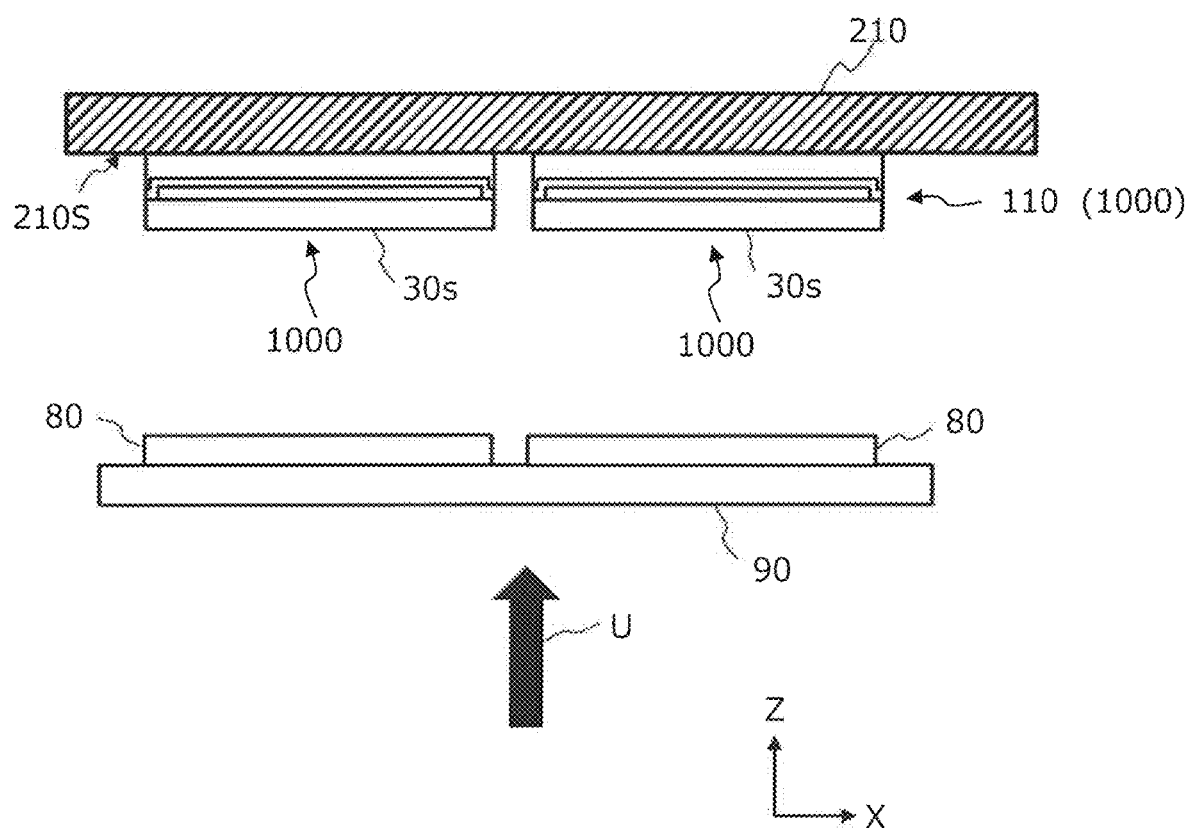
FIG. 23 is a cross-sectional view showing a carrier sheet carrying a plurality of parts which are to be mounted to the plurality of OLED devices.

FIG. 23 is a cross-sectional view showing a carrier sheet 90 carrying a plurality of parts (functional films) 80 which are to be mounted to the plurality of OLED devices 1000. By moving this carrier sheet 90 in the direction of arrow U, the respective parts 80 can be attached to the OLED devices 1000. The upper surface of the parts 80 has an adhesive layer which is capable of strongly adhering to the OLED devices 1000. Meanwhile, the adhesion between the carrier sheet 90 and the parts 80 is relatively weak. Using such a carrier sheet 90 enables a simultaneous "transfer" of the parts 80. Such a transfer is readily realized because the plurality of OLED devices 1000 are regularly arrayed on the stage 210 while the OLED devices 1000 are supported by the stage 210.

Multilayer Stack

Hereinafter, the configuration of the multilayer stack 100 before the dividing of FIG. 2 is described in more detail.

Figure 24A:
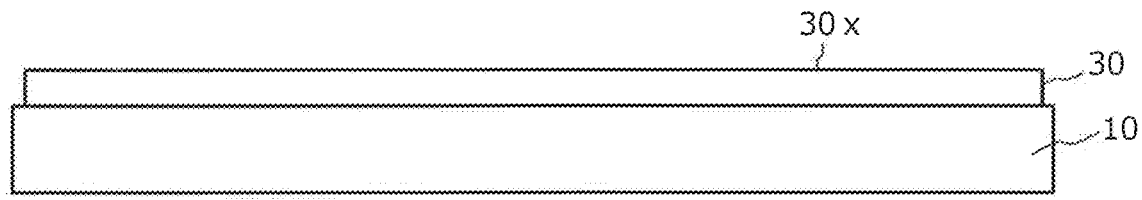
FIG. 24A is a cross-sectional view illustrating a step of the flexible OLED device production method in an embodiment of the present disclosure.

First, see FIG. 24A. FIG. 24A is a cross-sectional view showing the glass base 10 with the plastic film 30 provided on the surface of the glass base 10. The glass base 10 is a supporting substrate for processes. The thickness of the glass base 10 can be, for example, about 0.3-0.7 mm.

In the present embodiment, the plastic film 30 is a polyimide film having a thickness of, for example, not less than 5 μm and not more than 100 μm. The polyimide film can be formed from a polyamide acid, which is a precursor of polyimide, or a polyimide solution. The polyimide film may be formed by forming a polyamide acid film on the surface of the glass base 10 and then thermally imidizing the polyamide acid film. Alternatively, the polyimide film may be formed by forming, on the surface of the glass base 10, a film from a polyimide solution which is prepared by melting a polyimide or dissolving a polyimide in an organic solvent. The polyimide solution can be obtained by dissolving a known polyimide in an arbitrary organic solvent. The polyimide solution is applied to the surface 10s of the glass base 10 and then dried, whereby a polyimide film can be formed.

In the case of a bottom emission type flexible display, it is preferred that the polyimide film realizes high transmittance over the entire range of visible light. The transparency of the polyimide film can be represented by, for example, the total light transmittance in accordance with JIS K7105-1981. The total light transmittance can be set to not less than 80% or not less than 85%. On the other hand, in the case of a top emission type flexible display, it is not affected by the transmittance.

The plastic film 30 may be a film which is made of a synthetic resin other than polyimide. Note that, however, in the embodiment of the present disclosure, the process of forming a thin film transistor includes a heat treatment at, for example, not less than 350° C., and therefore, the plastic film 30 is made of a material which will not be deteriorated by this heat treatment.

The plastic film 30 may be a multilayer structure including a plurality of synthetic resin layers. In one form of the present embodiment, in delaminating a flexible display structure from the glass base 10, laser lift-off is carried out such that the plastic film 30 is irradiated with ultraviolet laser light transmitted through the glass base 10. A part of the plastic film 30 at the interface with the glass base 10 needs to absorb the ultraviolet laser light and decompose (disappear). Alternatively, for example, a sacrificial layer (thin metal or amorphous silicon layer) which is to absorb laser light of a certain wavelength band and produce a gas may be provided between the glass base 10 and the plastic film 30. In this case, the plastic film 30 can be easily delaminated from the glass base 10 by irradiating the sacrificial layer with the laser light. Providing the sacrificial layer also achieves the effect of suppressing generation of ashes.

Polishing

When there is an object (target) which is to be polished away, such as particles or protuberances, on the surface 30x of the plastic film 30, the target may be polished away using a polisher such that the surface becomes flat. Detection of a foreign object, such as particles, can be realized by, for example, processing of an image obtained by an image sensor. After the polishing process, a planarization process may be performed on the surface 30x of the plastic film 30. The planarization process includes the step of forming a film which improves the flatness (planarization film) on the surface 30x of the plastic film 30. The planarization film does not need to be made of a resin.

Lower Gas Barrier Film

Then, a gas barrier film may be formed on the plastic film 30. The gas barrier film can have various structures. Examples of the gas barrier film include a silicon oxide film and a silicon nitride film. Other examples of the gas barrier film can include a multilayer film including an organic material layer and an inorganic material layer. This gas barrier film may be referred to as "lower gas barrier film" so as to be distinguishable from a gas barrier film covering the functional layer regions 20, which will be described later. The gas barrier film covering the functional layer regions 20 can be referred to as "upper gas barrier film".

Functional Layer Region

Hereinafter, the process of forming the functional layer regions 20, including the TFT layer 20A and the OLED layer 20B, and the upper gas barrier film 40 is described.

Figure 24B:
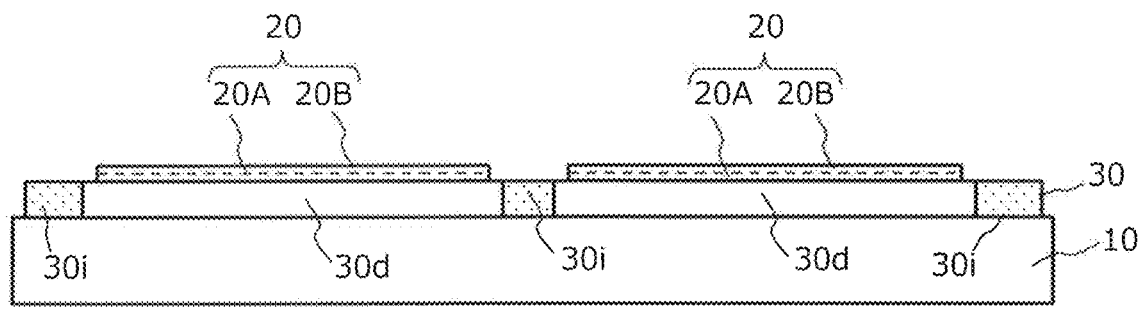
FIG. 24B is a cross-sectional view illustrating a step of the flexible OLED device production method in an embodiment of the present disclosure.

First, as shown in FIG. 24B, a plurality of functional layer regions 20 are formed on a glass base 10. There is a plastic film 30 between the glass base 10 and the functional layer regions 20. The plastic film 30 is bound to the glass base 10.

More specifically, the functional layer regions 20 include a TFT layer 20A (lower layer) and an OLED layer 20B (upper layer). The TFT layer 20A and the OLED layer 20B are sequentially formed by a known method. The TFT layer 20A includes a circuit of a TFT array which realizes an active matrix. The OLED layer 20B includes an array of OLED elements, each of which can be driven independently. The thickness of the TFT layer 20A is, for example, 4 µm. The thickness of the OLED layer 20B is, for example, 1 µm.

Figure 25:
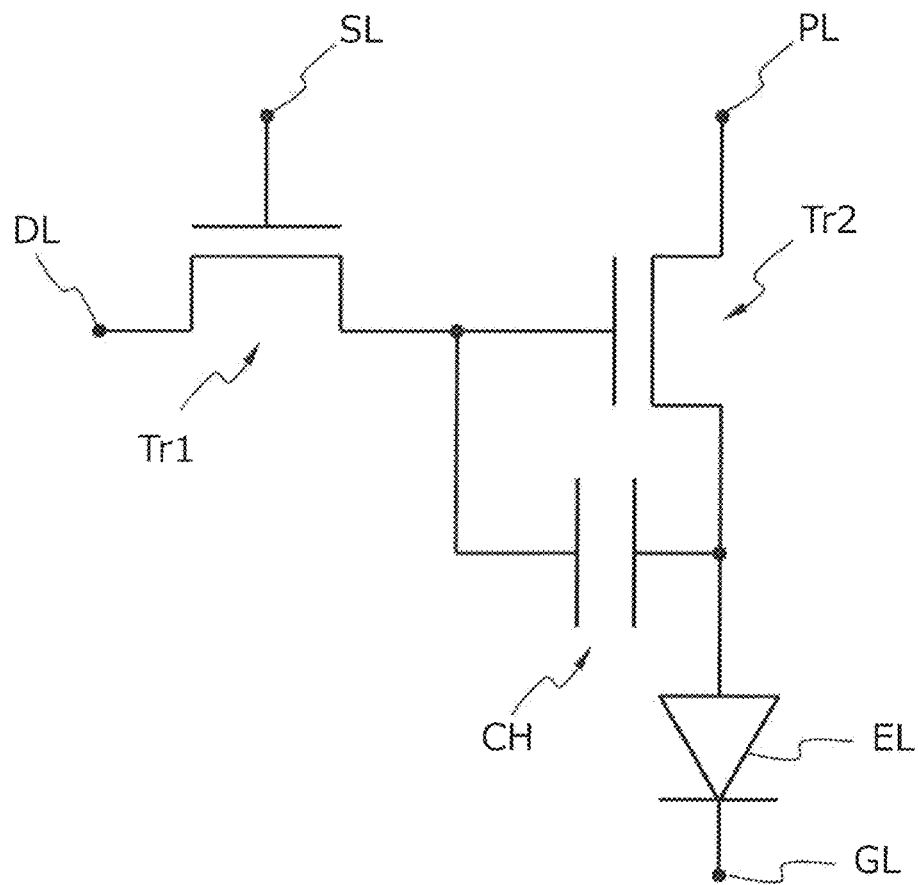
FIG. 25 is an equivalent circuit diagram of a single sub-pixel in a flexible OLED device.

FIG. 25 is a basic equivalent circuit diagram of a sub-pixel in an organic EL (Electro Luminescence) display. A single pixel of the display can consist of sub-pixels of different colors such as, for example, R (red), G (green), and B (blue). The example illustrated in FIG. 25 includes a selection TFT element Tr1, a driving TFT element Tr2, a storage capacitor CH, and an OLED element EL. The selection TFT element Tr1 is connected with a data line DL and a selection line SL. The data line DL is a line for transmitting data signals which define an image to be displayed. The data line DL is electrically coupled with the gate of the driving TFT element Tr2 via the selection TFT element Tr1. The selection line SL is a line for transmitting signals for controlling the ON/OFF state of the selection TFT element Tr1. The driving TFT element Tr2 controls the state of the electrical connection between a power line PL and the OLED element EL. When the driving TFT element Tr2 is ON, an electric current flows from the power line PL to a ground line GL via the OLED element EL. This electric current allows the OLED element EL to emit light. Even when the selection TFT element Tr1 is OFF, the storage capacitor CH maintains the ON state of the driving TFT element Tr2.

The TFT layer 20A includes a selection TFT element Tr1, a driving TFT element Tr2, a data line DL, and a selection line SL. The OLED layer 20B includes an OLED element EL. Before formation of the OLED layer 20B, the upper surface of the TFT layer 20A is planarized by an interlayer insulating film that covers the TFT array and various wires. A structure which supports the OLED layer 20B and which realizes active matrix driving of the OLED layer 20B is referred to as "backplane".

The circuit elements and part of the lines shown in FIG. 25 can be included in any of the TFT layer 20A and the OLED layer 20B. The lines shown in FIG. 25 are connected with an unshown driver circuit.

In the embodiment of the present disclosure, the TFT layer 20A and the OLED layer 20B can have various specific configurations. These configurations do not limit the present disclosure. The TFT element included in the TFT layer 20A may have a bottom gate type configuration or may have a top gate type configuration. Emission by the OLED element included in the OLED layer 20B may be of a bottom emission type or may be of a top emission type. The specific configuration of the OLED element is also arbitrary.

The material of a semiconductor layer which is a constituent of the TFT element includes, for example, crystalline silicon, amorphous silicon, and oxide semiconductor. In the embodiment of the present disclosure, part of the process of forming the TFT layer 20A includes a heat treatment step at 350° C. or higher for the purpose of improving the performance of the TFT element.

Upper Gas Barrier Film

Figure 24C:
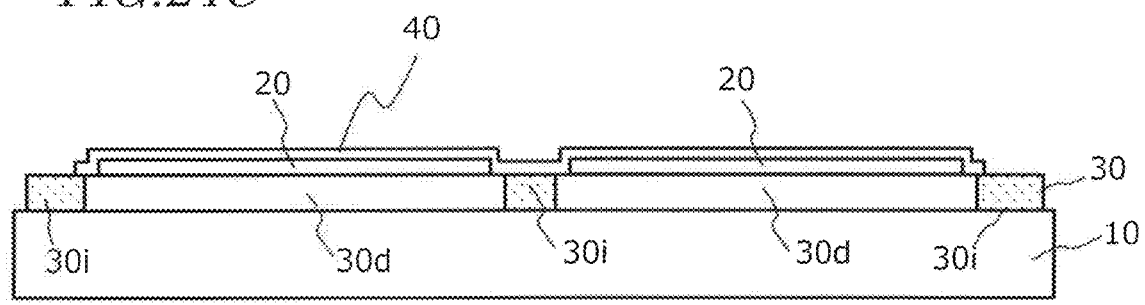
FIG. 24C is a cross-sectional view illustrating a step of the flexible OLED device production method in an embodiment of the present disclosure.

After formation of the above-described functional layer, the entirety of the functional layer regions 20 is covered with a gas barrier film (upper gas barrier film) 40 as shown in FIG. 24C. A typical example of the upper gas barrier film 40 is a multilayer film including an inorganic material layer and an organic material layer. Elements such as an adhesive film, another functional layer which is a constituent of a touch-screen, polarizers, etc., may be provided between the upper gas barrier film 40 and the functional layer regions 20 or in a layer overlying the upper gas barrier film 40. Formation of the upper gas barrier film 40 can be realized by a Thin Film Encapsulation (TFE) technique. From the viewpoint of encapsulation reliability, the WVTR (Water Vapor Transmission Rate) of a thin film encapsulation structure is typically required to be not more than $1 \times 10^{-4}$ g/m²/day. According to the embodiment of the present disclosure, this criterion is met. The thickness of the upper gas barrier film 40 is, for example, not more than 1.5 µm.

Figure 26:
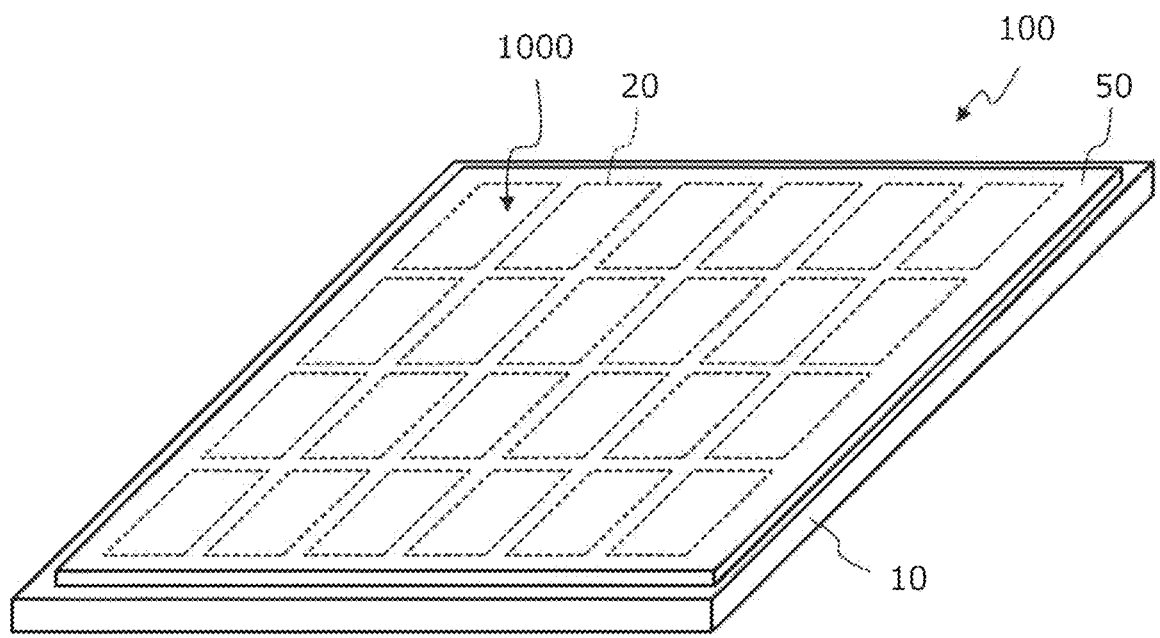
FIG. 26 is a perspective view of the multilayer stack in the middle of the production process.

FIG. 26 is a perspective view schematically showing the upper surface side of the multilayer stack 100 at a point in time when the upper gas barrier film 40 is formed. A single multilayer stack 100 includes a plurality of OLED devices 1000 supported by the glass base 10. In the example illustrated in FIG. 26, a single multilayer stack 100 includes a larger number of functional layer regions 20 than in the example illustrated in FIG. 1A. As previously described, the number of functional layer regions 20 supported by a single glass base 10 is arbitrary.

Protection Sheet

Figure 24D:
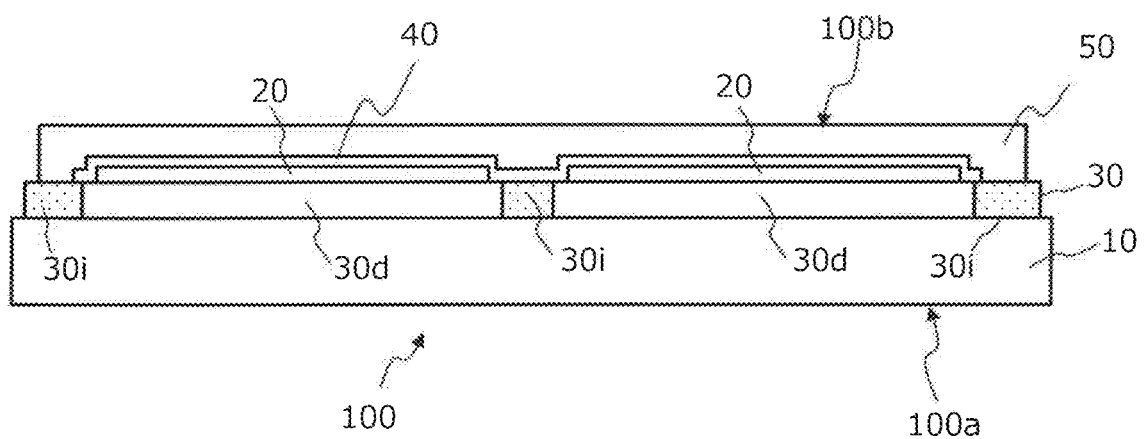
FIG. 24D is a cross-sectional view illustrating a step of the flexible OLED device production method in an embodiment of the present disclosure.

Next, refer to FIG. 24D. As shown in FIG. 24D, a protection sheet 50 is adhered to the upper surface of the multilayer stack 100. The protection sheet 50 can be made of a material such as, for example, polyethylene terephthalate (PET), polyvinyl chloride (PVC), or the like. As previously described, a typical example of the protection sheet 50 has a laminate structure which includes a layer of an applied mold-releasing agent at the surface. The thickness of the protection sheet 50 can be, for example, not less than 50 µm and not more than 200 µm.

After the thus-formed multilayer stack 100 is provided, the production method of the present disclosure can be carried out using the above-described production apparatus (LLO unit 220).

INDUSTRIAL APPLICABILITY

An embodiment of the present invention provides a novel flexible OLED device production method. A flexible OLED device is broadly applicable to smartphones, tablet computers, on-board displays, and small-, medium- and large-sized television sets.

REFERENCE SIGNS LIST

10 . . . glass base, 20 . . . functional layer region, 20A . . . TFT layer, 20B . . . OLED layer, 30 . . . plastic film, 30d . . . flexible substrate region of plastic film, 30i . . . intermediate region of plastic film, 40 . . . gas barrier film, 50 . . . protection sheet, 100 . . . multilayer stack, 210 . . . stage, 220 . . . LLO unit, 260 . . . controller, 300 . . . semiconductor laser device, 1000 . . . OLED device

The invention claimed is:

1. An apparatus for producing a flexible OLED device, comprising:
a stage for supporting a multilayer stack which has a first surface and a second surface, the multilayer stack including a glass base which defines the first surface, a functional layer region including a TFT layer and an OLED layer, a synthetic resin film provided between the glass base and the functional layer region and bound to the glass base, the synthetic resin film including a flexible substrate region supporting the functional layer region and an intermediate region surrounding the flexible substrate region, and a protection sheet which covers the functional layer region and which defines the second surface, the intermediate region and the flexible substrate region of the synthetic resin film being divided from each other; and a lift-off light irradiation unit for irradiating with laser light an interface between the synthetic resin film and the glass base in the multilayer stack supported by the stage, wherein the lift-off light irradiation unit includes a plurality of arranged laser light sources for forming the laser light, and an irradiation intensity of the laser light for at least part of an interface between the intermediate region of the synthetic resin film and the glass base is lower than an irradiation intensity of the laser light for the interface between the flexible substrate region of the synthetic resin film and the glass base, the apparatus further comprising an actuator for increasing a distance from the stage to the glass base while the stage is kept in contact with the second surface of the multilayer stack, thereby separating the multilayer stack into a first portion and a second portion, wherein the first portion of the multilayer stack includes an OLED device which is in contact with the stage, the OLED device including the functional layer region and the flexible substrate region of the synthetic resin film, and the second portion of the multilayer stack includes the glass base and the intermediate region of the synthetic resin film.

2. The apparatus of claim 1, wherein the plurality of laser light sources are a plurality of semiconductor laser devices, and the lift-off light irradiation unit includes a laser driving circuit for modulating a driving current flowing through each of the plurality of semiconductor laser devices, thereby temporally and/or spatially modulating the irradiation intensity of the laser light.

3. The apparatus of claim 2, wherein the plurality of semiconductor laser devices are arranged in a single row or a plurality of rows, and the irradiation intensity of the laser light has four or more peaks at the interface between the intermediate region of the synthetic resin film and the glass base.

* * * * *